(12) United States Patent
Hatakeyama et al.

(10) Patent No.: US 8,450,048 B2
(45) Date of Patent: May 28, 2013

(54) METHOD FOR FORMING RESIST UNDERLAYER FILM, PATTERNING PROCESS USING THE SAME, AND COMPOSITION FOR THE RESIST UNDERLAYER FILM

(75) Inventors: Jun Hatakeyama, Jyoetsu (JP); Toshihiko Fujii, Jyoetsu (JP); Tsutomu Ogihara, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 672 days.

(21) Appl. No.: 12/585,387

(22) Filed: Sep. 14, 2009

(65) Prior Publication Data

US 2010/0099044 A1    Apr. 22, 2010

(30) Foreign Application Priority Data

Oct. 20, 2008  (JP) .................................. 2008-270158

(51) Int. Cl.
*G03F 7/40* (2006.01)
*G03F 7/11* (2006.01)

(52) U.S. Cl.
USPC ........ 430/313; 430/271.1; 430/318; 430/316; 430/314; 430/272.1; 427/386

(58) Field of Classification Search
None
See application file for complete search history.

(56) References Cited

U.S. PATENT DOCUMENTS 5,886,119 A    3/1999   Schaedeli et al.
5,972,560 A    10/1999  Kaneko et al.

(Continued)

FOREIGN PATENT DOCUMENTS

JP    A-06-118651    4/1994
JP    A-09-110938    4/1997

(Continued)

OTHER PUBLICATIONS

Sinha et al, Journal of the Electrochemical Society, vol. 153, (5), G465-G469 (2006) electronically available on Marech 27, 2006.*

(Continued)

*Primary Examiner* — Cynthia Hamilton
(74) *Attorney, Agent, or Firm* — Oliff & Berridge, PLC

(57) ABSTRACT

There is disclosed a method for forming a resist underlayer film of a multilayer resist film having at least three layers used in a lithography, comprising at least; a step of coating a composition for resist underlayer film containing a novolak resin represented by the following general formula (1) obtained by treating a compound having a bisnaphthol group on a substrate; and a step of curing the coated composition for the resist underlayer film by a heat treatment at a temperature above 300° C. and 600° C. or lower for 10 to 600 seconds. There can be provided a method for forming a resist underlayer film, and a patterning process using the method to form a resist underlayer film in a multilayer resist film having at least three layers used in a lithography, gives a resist underlayer film having a lowered reflectance, a high etching resistance, and a high heat and solvent resistances, especially without wiggling during substrate etching.

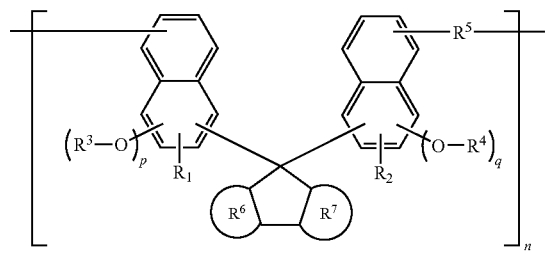

(1)

22 Claims, 7 Drawing Sheets

U.S. PATENT DOCUMENTS

| | | | |
|---|---|---|---|
| 6,309,796 B1 | 10/2001 | Nakashima et al. | |
| 6,420,088 B1 | 7/2002 | Angelopoulos et al. | |
| 6,461,717 B1 | 10/2002 | Rutter, Jr. et al. | |
| 6,506,497 B1 | 1/2003 | Kennedy et al. | |
| 2002/0012871 A1 | 1/2002 | Hatakeyama et al. | |
| 2002/0086934 A1 | 7/2002 | Kawaguchi et al. | |
| 2002/0106909 A1 | 8/2002 | Kato et al. | |
| 2002/0119612 A1* | 8/2002 | Ohuchi et al. | 438/200 |
| 2004/0241577 A1 | 12/2004 | Hatakeyama et al. | |
| 2004/0259037 A1 | 12/2004 | Hatakeyama et al. | |
| 2005/0255712 A1 | 11/2005 | Kato et al. | |
| 2006/0014106 A1 | 1/2006 | Hatakeyama et al. | |
| 2006/0019195 A1 | 1/2006 | Hatakeyama et al. | |
| 2006/0204891 A1 | 9/2006 | Hatakeyama | |
| 2007/0122740 A1 | 5/2007 | Hatakeyama et al. | |
| 2007/0275325 A1 | 11/2007 | Hatakeyama et al. | |
| 2008/0118860 A1 | 5/2008 | Harada et al. | |
| 2009/0081595 A1* | 3/2009 | Hatakeyama et al. | 430/323 |

FOREIGN PATENT DOCUMENTS

| | | |
|---|---|---|
| JP | A-10-324748 | 12/1998 |
| JP | A-11-154638 | 6/1999 |
| JP | A-11-302382 | 11/1999 |
| JP | A-2001-040293 | 2/2001 |
| JP | A-2002-014474 | 1/2002 |
| JP | A-2002-047430 | 2/2002 |
| JP | A-2002-055456 | 2/2002 |
| JP | A-2002-214777 | 7/2002 |
| JP | A-2002-334869 | 11/2002 |
| JP | B2-3504247 | 12/2003 |
| JP | A-2004-205658 | 7/2004 |
| JP | A-2004-205676 | 7/2004 |
| JP | A-2004-205685 | 7/2004 |
| JP | A-2004-354554 | 12/2004 |
| JP | A-2005-010431 | 1/2005 |
| JP | A-2005-128509 | 5/2005 |
| JP | A-2005-250434 | 9/2005 |
| JP | A-2006-053543 | 2/2006 |
| JP | A-2006-227391 | 8/2006 |
| JP | A-2006-259249 | 9/2006 |
| JP | A-2006-259482 | 9/2006 |
| JP | A-2006-285095 | 10/2006 |
| JP | A-2006-293298 | 10/2006 |
| JP | A-2007-171895 | 7/2007 |
| JP | A-2007-199653 | 8/2007 |
| JP | A-2007-316282 | 12/2007 |
| JP | A-2008-026600 | 2/2008 |
| JP | A-2008-096684 | 4/2008 |
| JP | A-2008-111103 | 5/2008 |
| WO | WO 2004/066377 A1 | 8/2004 |
| WO | WO 2008/150058 A1 | 12/2008 |
| WO | WO 2010/041626 A1 | 4/2010 |

OTHER PUBLICATIONS

Noda et al., "A Comment on the Structure of Glassy Carbon," *Notes*, Mie University, 1968, vol. 41., No. 12, pp. 3023-3024.

Schaedeli et al., "Evaluation of Materials for 193-nm Lithography," *Journal of Photopolymer Science and Technology*, 1996, vol. 9, No. 3, pp. 435-446.

Moran et al., "High resolution, steep profile resist patterns," *J. Vac. Sci. Technolo.*, 1979, vol. 16, No. 1, pp. 1620-1624.

Abe et al., "Sub-55-nm Etch Process Using Stacked-Mask Process," 2005 Dry Process International Symposium, pp. 11-12.

Lynch et al., "Properties and Performance of Near UV Reflectivity Control Layers," Proceedings of SPIE, 1994, pp. 225-229.

Johnson, "Thermolysis of Positive Photoresists," Proceedings of SPIE, 1984, vol. 469, pp. 72-79.

Brunsvold et al., "Evaluation of a Deep UV Bilayer Resist for Sub-Half Micron Lithography," Proceedings of SPIE, 1993, vol. 1925, pp. 377-387.

Hatakeyama et al., "Investigation of Discrimination Enhancement in Polysilsesquioxane Based Positive Resist for ArF Lithography," Proceedings of SPIE, 1998, vol. 3333, pp. 62-72.

Kwong et al., "IBM 193nm Bilayer Resist: Materials, Lithographic Performance and Optimization," Proceedings of SPIE, 2001, vol. 4345, pp. 50-57.

Nov. 13, 2012 Office Action issued in Japanese Patent Application No. 2009-203394 (with translation).

\* cited by examiner

500°C : -3%

METHOD FOR FORMING RESIST UNDERLAYER FILM, PATTERNING PROCESS USING THE SAME, AND COMPOSITION FOR THE RESIST UNDERLAYER FILM

BACKGROUND OF THE INVENTION

1. Field of the Invention

The present invention relates to a composition for a resist underlayer film useful as a composition for an anti-reflection film used in microfabrication in manufacturing of a semiconductor device and the like, and to a resist patterning process using this, suitable for exposure by a KrF excimer beam (248 nm), an ArF excimer beam (193 nm), an $F_2$ laser beam (157 nm), a $Kr_2$ laser beam (146 nm), an $Ar_2$ laser beam (126 nm), a soft X-ray (EUV, 13.5 nm), an electron beam (EB), and an X-ray.

2. Description of the Related Art

As LSI is progressing toward a higher integration and a faster speed in recent years, further miniaturization of a pattern rule is required. Under such a movement, a lithography using a light exposure, which is a widely used technology today, is reaching a limit of its resolution power inherent to a wavelength of a light source.

As a light source for a lithography used in a resist patterning process, light-exposures with a g-line (436 nm) and an i-line (365 nm) have been widely used. For further miniaturization, a method in which an exposing light is shifting toward a shorter wavelength has been considered to be effective. Accordingly, in place of an i-line (365 nm), a KrF excimer laser (248 nm), which emits a shorter wavelength than the i-line, has been used in a mass production process for a 64 Mbit DRAM. However, for production of DRAM with an integration of 1 G or more, which requires a further miniaturized process technology (processing dimension of 0.13 µm or less), a light source with a further shorter wavelength is required, and thus, a lithography using an ArF excimer laser (193 nm) has been investigated particularly.

On the other hand, it has been known in the past that a bilayer process is excellent in formation of a pattern having a high aspect ratio on a nonplanar substrate. To develop a bilayer resist film by generally used alkaline developer, a silicone polymer having a hydrophilic group such as a hydroxy group and a carboxyl group is necessary.

As a silicone-type positive resist composition of chemically amplified type, a silicon-type positive resist composition of chemically amplified type using a base resin, which is obtained by protecting a part of a phenolic hydroxy group of polyhydroxybenzyl silsesquioxane, a stable alkaline-soluble silicone polymer, with a t-Boc group, together with an acid generator is proposed for a KrF excimer laser (see, for examples, Japanese Patent Laid-Open (kokai) No. H6-118651 and SPIE Vol. 1925 (1993), p. 377). For an ArF eximer laser, a positive resist composition based on a silsesquioxane whose cyclohexyl carboxylic acid is substituted with an acid-labile group is proposed (see, for example Japanese Patent Laid-Open (kokai) No. H10-324748 and Japanese Patent Laid-Open (kokai) No. H11-302382, and SPIE Vol. 3333 (1998), p. 62). Further, a positive resist composition based on a silsesquioxane having a hexafluoroisopropanol as a soluble group is proposed for an $F_2$ excimer laser (see, for example, Japanese Patent Laid-Open (kokai) No. 2002-55456). The above-mentioned polymers contain a polysilsesquioxane having a ladder skeleton in their main chain made by polycondensation of a trialkoxy silane or a trihalogenated silane.

As a resist base polymer having a silicon pendant on its side chain, a polymer of a silicon-containing (meth)acrylate ester is proposed (see, for example Japanese Patent Laid-Open (kokai) No. H9-110938 and J. Photopolymer Sci. and Technol., Vol. 9, No. 3 (1996), p. 435-446).

A resist underlayer film in a bilayer process is formed of a hydrocarbon compound, which can be etched by an oxygen gas, and in addition, needs to have a high etching resistance because it becomes a mask when a substrate under it is etched. For etching by an oxygen gas, the film must be composed of only a hydrocarbon, not containing a silicon atom. In addition, the film needs to have a function as an anti-reflection film in order to improve a controllability of a line width of a silicon-containing resist film above it and to form less bumps on a pattern sidewall and to reduce collapsing of a pattern by a standing wave. Specifically, a reflectance from an underlayer film to a resist upperlayer film needs to be made 1% or less.

Here, calculation results of the reflectance till a film thickness of maximum 500 nm are shown in FIGS. 2 and 3. In FIG. 2, assumptions are made 193 nm for a wavelength of an exposure light, and 1.74 for an n-value and 0.02 for a k-value of the resist upperlayer film. A substrate reflectance is shown for the case where the k-value of the resist underlayer film is fixed at 0.3 with varying the n-value from 1.0 to 2.0 in a vertical axis and a film thickness from 0 to 500 nm in a horizontal axis. When a resist underlayer film with a film thickness of 300 nm or more is assumed in a bilayer process, there is an optimum value to make a reflectance 1% or less within the n-value range of 1.6 to 1.9, which is the same as or a little higher refractive index as compared with the resist upperlayer film.

In FIG. 3, a reflectance is shown in the case where the n-value of the resist underlayer film is fixed at 1.5 with varying the k-value from 0 to 0.8. When a resist underlayer film with a film thickness of 300 nm or more is assumed in a bilayer process, it is possible to make the reflectance 1% or less within the k-value range of 0.24 to 0.15. On the other hand, the optimum k-value of an anti-reflection film in a monolayer resist process used in a thin film with a thickness of about 40 nm is 0.4 to 0.5, which is different from the optimum k-value of a resist underlayer film in a bilayer process with a film thickness of 300 nm or more. This suggests that a further lower k-value, namely a further higher transparent resist underlayer film, is required in a resist underlayer film in a bilayer process.

As disclosed in SPIE Vol. 4345 (2001), p. 50, a copolymer of polyhydroxy styrene and an acrylate ester is investigated as a composition for a resist underlayer film for a 193 nm wavelength. Polyhydroxy styrene has a very strong absorption at 193 nm, and the k-value of itself is about 0.6, which is too high. Accordingly, the k-value is controlled in the vicinity of 0.25 by copolymerizing it with an acrylate ester whose k-value is almost zero.

However, an etching resistance of an acrylate ester in a substrate etching is low as compared with polyhydroxy styrene. In addition, in order to lower the k-value, a considerably large ratio of an acrylate ester needs to be copolymerized, thereby leading to considerable decrease in the resistance in the substrate etching. The etching resistance not only affects an etching rate but also a surface roughness after the etching. An increase in the surface roughness after the etching is an acute problem caused by copolymerization of an acrylate ester.

On the other hand, a trilayer process, which involves lamination of a resist upperlayer film of a monolayer resist not containing a silicon, under which a resist intermediate layer film containing a silicon, under which a resist underlayer film of an organic film, is proposed (see for example J. Vac. Sci. Technol., 16 (6), November/December 1979). Generally, a monolayer resist has a higher resolution as compared with a silicon-containing resist, and thus a monolayer resist with a high resolution can be used as an exposure imaging layer in a trilayer process. A spin-on glass (SOG) film is used as a resist intermediate layer film, and many SOG films are proposed.

An optimum optical constant of an underlayer film to suppress a substrate reflection in a trilayer process is different from that in a bilayer process. In a bilayer process a resist underlayer film is solely responsible for an anti-reflection effect, while in a trilayer process a resist intermediate layer film and/or a resist underlayer film may be responsible for the said effect, though there is no difference between the bilayer process and the trilayer process in the purpose to suppress the substrate reflection as low as possible, specifically 1% or less.

A composition for a silicon-containing layer having an anti-reflection effect is proposed in U.S. Pat. No. 6,506,497 and U.S. Pat. No. 6,420,088. Generally, an anti-reflection effect is higher in a multilayer anti-reflection film than in a monolayer anti-reflection film, and thus the former is used widely as an anti-reflection film in an optical composition. A high anti-reflection effect may be obtained by rendering an anti-reflection effect to both a resist intermediate layer film and a resist underlayer film.

If a silicon-containing resist intermediate layer film is rendered with an anti-reflection function in a trilayer process, an utmost anti-reflection effect as requested for a resist underlayer film in a bilayer process is not particularly necessary. In a trilayer process, the resist underlayer film is requested to have a high etching resistance in a substrate processing rather than to have the anti-reflection effect.

Accordingly, a novolak resin, which contains many aromatic groups and has a high etching resistance, has been used as a resist underlayer film in a trilayer process.

In FIG. 4, a substrate reflectance with a varied k-value of a resist intermediate layer film is shown.

A sufficient anti-reflection effect with the reflectance of 1% or lower may be obtained by setting the k-value of a resist intermediate layer film at low, i.e., 0.2 or less, and a film thickness appropriately.

Usually, in order to suppress the reflectance to 1% or less with a film thickness of 100 nm or less, the k-value of an anti-reflection film needs to be 0.2 or more (see FIG. 3). However, in a trilayer resist film in which a certain degree of reflection can be suppressed in the resist underlayer film, an optimum k-value for the resist intermediate layer film is less than 0.2.

In FIG. 5 and FIG. 6, an effect on the reflectance is shown when the thickness of a resist intermediate layer film and of a resist underlayer film are varied with the fixed k-value of the resist underlayer film at 0.2 and 0.6. The resist underlayer film with the k-value of 0.2 in FIG. 5 is assumed for the optimum case of the resist underlayer film in a bilayer process. The k-value of 0.6 for the resist underlayer film in FIG. 6 is near to the k-value of a novolak or polyhydroxy styrene at 193 nm wavelength.

A film thickness of a resist underlayer film changes with topography of a substrate, while a film thickness of a resist intermediate layer hardly changes, and thus it is assumed that an intended thickness can be obtained with application of a solution.

A higher k-value of a resist underlayer film (the case of 0.6) can suppress the reflectance to 1% or less with a thinner film. When the k-value of a resist underlayer film is 0.2 with a film thickness of 250 nm, a thickness of a resist intermediate layer film needs to be increased in order to make a reflectance of 1%. However, when a thickness of a resist intermediate layer film is increased like this, a load of the uppermost resist film is high during processing of the resist intermediate layer by dry-etching, which is not desirable.

FIG. 5 and FIG. 6 show reflection in a dry exposure with an NA of an exposure lens being 0.85. It suggests that a reflectance may be made 1% or less independent of a k-value of a resist underlayer film by optimizing an n-value, a k-value, and a thickness of a resist intermediate layer film in a trilayer process. On the other hand, by an immersion lithography, an NA of a projector lens exceeds 1.0, and incidence light angles not only to a resist but also to an anti-reflection film underneath the resist become shallow. An anti-reflection film suppresses a reflection by not only an absorption by itself but also a compensation action of a light interference effect. A light interference effect of a skew light is small so that reflection increases. A resist intermediate layer film is responsible for an anti-reflection by a light interference effect among the films in a trilayer process. A resist underlayer film is too thick to effect an anti-reflection by light interference compensation. A reflection from a resist underlayer film surface needs to be suppressed, and for that, it is required that the k-value of a resist underlayer film be less than 0.6 and the n-value be near to that of the resist intermediate layer film on it. When the k-value is too small thereby too high in transparency, reflection from a substrate becomes eminent so that an optimum k-value becomes between about 0.25 to about 0.48 for the case of an immersion exposure with NA of 1.3. The target of the n-value is near 1.7, which is the n-value of a resist in both an intermediate layer as well as a underlayer.

A benzene ring has a very strong absorption so that the k-value of a cresol novolak or polyhydroxy styrene is over 0.6. One of those having a higher transparency at 193 nm than a benzene ring and a high etching resistance is a naphthalene ring. For example, a resist underlayer film having a naphthalene ring or an anthracene ring is proposed in Japanese Patent Laid-Open (kokai) No. 2002-14474. According to our measurement, the k-values of a naphthol copolycondensed novolak resin and a polyvinyl naphthalene resin are in a range of 0.3 to 0.4.

The n-values of a naphthol copolycondensed novolak resin and a polyvinyl naphthalene resin at 193 nm is low, i.e., 1.4 for a naphthol copolycondensed novolak resin and further lower, i.e., 1.2, for a polyvinyl naphthalene resin. For example, an acenaphthylene polymer shown in Japanese Patent Laid-Open (kokai) No. 2001-40293 and Japanese Patent Laid-Open (kokai) No. 2002-214777 has the n-value of 1.5, and the k-value of 0.4, which is close to targeted values. A transparent underlayer film with a high n-value and a low k-value and having a high etching resistance is desired.

In Japanese Patent Laid-Open (kokai) No. 2007-199653, a composition for a resist underlayer film having a bisnaphthol group, which has the n-value and the k-value near to their target values and with an excellent etching resistance, is proposed.

In the case when an underlying substrate to be processed is nonplanar, the nonplanarity needs to be made flat by a resist underlayer film. Flattening of the resist underlayer film will suppress a change in thickness of a resist intermediate layer film formed on it and of a photoresist film, which is a resist upperlayer film, thereby enlarging a lithography focus margin.

However, in an amorphous carbon underlayer film formed by a chemical vapor deposition (CVD) method using a raw composition gas such as methane, ethane, and acetylene, it is difficult to fill in the nonplanarity to flat. On the other hand, formation of a resist underlayer film by a spin coat method has an advantage of filling in substrate's concavity and convexity. Further, in order to improve gap filling characteristics of a coating composition by application, as shown in Japanese Patent Laid-Open (kokai) No. 2002-47430, a method in which a novolak having a low molecular weight with a wide molecular weight distribution is used is proposed. As shown in Japanese Patent Laid-Open (kokai) No. H11-154638, a method in which a base polymer is blended with a low-molecular weight compound having a low melting point is proposed.

It has been well known in the past that a novolak resin is cured by intramolecular crosslinking only by heating (SPIE Vol. 469 (1984), p. 72). In it, a crosslinking mechanism that a phenoxy radical, generated in a hydroxy group of a cresol novolak by heating, moves to a connecting methylene group of the novolak resin by resonance, thereby inducing a radical coupling of methylene groups among themselves for crosslinking is reported. In U.S. Pat. No. 3,504,247, a patterning process using an underlayer film having an increased carbon density, which is obtained by a dehydrogenation reaction or a dehydration condensation reaction of a polycyclic aromatic compound such as a polyarylene, a naphthol novolak, and a hydroxy anthracene novolak by heating, is reported.

A glassy carbon film is formed by heating at a temperature of 800° C. or higher (Glass Carbon Bull. Chem. Soc. JPN., 41 (12), 3023-3024 (1968)). However, in view of an effect on device damage or wafer deformation, the highest temperature allowed for heating in a lithography wafer process is 600° C. or lower, and preferably 500° C. or lower.

It is reported that, as a process line width progresses toward narrower, a phenomenon such as wiggling and bending of a resist underlayer film occurs when a substrate to be processed is etched by using a resist underlayer film as a mask (Proc. of Symp. Dry. Process, (2005), p. 11). A phenomenon of displacement of a hydrogen atom in a resist underlayer film with a fluorine atom during substrate etching by a fluorocarbon gas is shown. It is assumed that wiggling of a further fine pattern takes place by volumetric swelling of a resist underlayer film or a lowered glass transition temperature as a surface of a resist underlayer film is changed to a Teflon (registered trade name). In the foregoing Document, it is shown that wiggling can be prevented from occurring by using a resist underlayer film with low hydrogen content. An amorphous carbon film made by a CVD method can reduce a hydrogen amount in the film remarkably well so that it is highly effective for prevention of wiggling from occurring. However, introduction of a CVD method is difficult in a certain case because it is poor in gap filling characteristics of nonplanarity as mentioned before, and the equipment is expensive and requires a large footprint area. If the wiggling problem should be solved by a composition for an underlayer film, which is formable by application, especially by a coating, especially a spin coat method, it would be of great merits because its process and equipment are simplified.

A multilayer process, which involves formation of a hard mask onto a resist underlayer film by a CVD method, is under investigation. In a silicon-type hard mask (a silicon oxide film, a silicon nitride film, and an silicon oxynitride film) too, an inorganic hard mask formed by a CVD method and the like has a higher etching resistance than a hard mask formed by a spin coat method. There is a case when a substrate to be processed is a low dielectric constant film, and poisons a photo resist (i.e., poisoning). In such a case, a CVD film is more effective as a film to block the poisoning.

Accordingly, a process, in which a resist underlayer film is formed by a spin coat method for flattening, and then an inorganic hard mask intermediate layer film as a resist intermediate layer film is formed on it by a CVD method, is under investigation. When an inorganic hard mask intermediate layer is formed by a CVD method, especially in the case of a nitride film formation, it is assumed that heating of a substrate at 300° C. lowest, usually at 400° C. is necessary. Accordingly, when a resist underlayer film is formed by a spin coat method, a heat resistance of 400° C. is necessary. However, not only a usually used cresol novolak or naphthol novolak but also a highly heat resistant fluorene bisphenol cannot endure heating at 400° C., resulting in a substantial film reduction after heating. Accordingly, a resist underlayer film having a heat resistance endurable a heat treatment at a high temperature in the formation of an inorganic hard mask intermediate film by a CVD method is required.

Because of a film reduction and a resin deterioration after heat-treatment due to such a low heat resistance, a heat treatment of a composition for a resist underlayer film has been carried out at 300° C. or lower (preferably in a range of 80 to 300° C.). However, problems such as a film reduction after treatment with a solvent and a pattern wiggling during substrate etching have been still remaining unsolved.

As mentioned above, a method for forming a resist underlayer film having optimum n-value and k-value as an anti-reflection film with good gap filling characteristics, excellent resistances to etching as well as solvent, a heat resistance endurable a heat treatment at a high temperature in the formation of an inorganic hard mask intermediate film by a CVD method and the like, and without wiggling during substrate etching is desired together with a composition for the resist underlayer film usable in such a method.

SUMMARY OF THE INVENTION

The present invention is made in view of the above situation and has an object to provide a method for forming a resist underlayer film, and a patterning process using the method to form a resist underlayer film in a multilayer resist film having at least three layers used in a lithography, gives a resist underlayer film having a lowered reflectance, a high etching resistance, and high heat and solvent resistances, especially without wiggling during substrate etching. Further, the present invention has an object to provide the composition, which is a composition for a resist underlayer film for formation of a resist underlayer film of a multilayer resist film, for a resist underlayer film for formation of a resist underlayer film having a lowered reflectance, especially a high etching resistance, a high heat resistance, and without wiggling during substrate etching.

In order to address the problems as mentioned above, the present invention provides a method for forming a resist underlayer film of a multilayer resist film having at least three layers used in a lithography, comprising at least; a step of coating a composition for a resist underlayer film containing a novolak resin represented by the following general formula (1) obtained by treating a compound having a bisnaphthol group on a substrate; and a step of curing the coated composition for a resist underlayer film by a heat treatment at a temperature of above 300° C. and 600° C. or lower for 10 to 600 seconds,

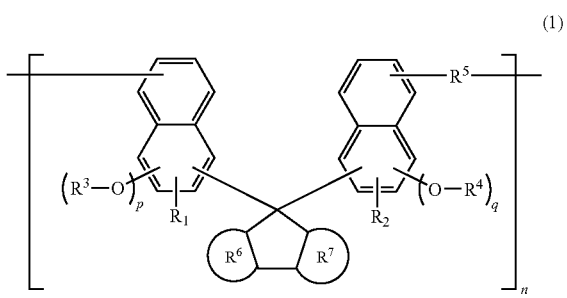

(1)

wherein $R^1$ and $R^2$ represent the same or a different hydrogen atom, a linear, a branched, or a cyclic alkyl group having 1 to 10 carbon atoms, an aryl group having 6 to 20 carbon atoms, or an alkenyl group having 2 to 20 carbon atoms; $R^3$ and $R^4$ each represents a hydrogen atom or a glycidyl group; $R^5$ represents a single bond, or a linear or a branched alkylene group having 1 to 10 carbon atoms; $R^6$ and $R^7$ represent a benzene ring or a naphthalene ring; each reference character p and q represents 1 or 2; and a reference character n is $0<n\leq 1$.

By using the method for forming a resist underlayer film as mentioned above, a resist underlayer film having optimum n-value and k-value as an anti-reflection film and gap filling characteristics, an excellent etching resistance, and high heat and solvent resistances, especially without wiggling during substrate etching may be formed.

In addition, the composition for a resist underlayer film to be coated on the substrate contains preferably a resin represented by the following general formula (2) and having a weight-average molecular weight of 500 to 100,000,

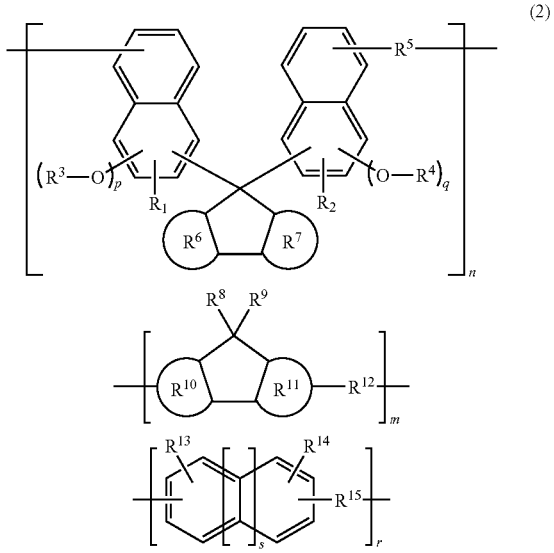

(2)

wherein $R^1$ to $R^7$, and reference characters p and q represent the same meaning as before; $R^8$ and $R^9$ represent a hydrogen atom, a hydroxy group, an acyl group having 1 to 6 carbon atoms, an alkoxy group having 1 to 6 carbon atoms, an alkoxycarbonyl group having 1 to 6 carbon atoms, a carbonyl group, an amino group, an imino group, a hydroxy group substituted with an acid-labile or a glycidyl group, or a linear, a branched, or a cyclic alkyl group having 1 to 10 carbon atoms, an aryl group having 6 to 20 carbon atoms, an alkenyl group having 2 to 10 carbon atoms, or an alkynyl group having 2 to 10 carbon atoms; $R^{10}$ and $R^{11}$ represent a benzene ring or a naphthalene ring; $R^{13}$ and $R^{14}$ represent a hydrogen atom, a hydroxy group, or a linear, a branched, or a cyclic alkyl group having 1 to 10 carbon atoms, wherein $R^{13}$ and $R^{14}$ may be bonded to form a ring; $R^{12}$ and $R^{15}$ represent a linear or a branched alkylene group having 1 to 10 carbon atoms; reference character s represents 1 or 2; and each reference character n, m, and r satisfies $0<n<1.0$, $0\leq m<1.0$, $0\leq r<1.0$, and $0<m+r<1.0$.

As the composition for the resist underlayer film as mentioned above, when a composition containing a resin represented by the above general formula (2), which is obtained by copolymerizing, in addition to a repeating unit "n", a repeating unit "m" and/or a repeating unit "r", and having a weight-average molecular weight of 500 to 100,000 is used, an etching resistance may be further improved.

Here, the step of coating the composition for a resist underlayer film on the substrate is preferably carried out by a spin coat method.

Accordingly, there may be mentioned a spin coat method as the method for coating a composition for a resist underlayer film on the substrate. When a resist underlayer film is formed by a spin coat method, substrate's concavity and convexity can be filled.

In addition, the present invention provides a patterning process to form a pattern on a substrate by a lithography, comprising at least; forming a resist underlayer film on a substrate by the method for forming the resist underlayer film as mentioned above; forming a resist intermediate layer film by using a composition for the resist intermediate layer film containing a silicon atom on the resist underlayer film; forming a resist upperlayer film by using a composition for the resist upperlayer film consisting of a photoresist composition on the resist intermediate layer film; forming a resist pattern on the resist upperlayer film by development with a developer after exposing a pattern circuit region of the resist upperlayer film; etching the resist intermediate layer film by using the obtained resist pattern as an etching mask; etching the resist underlayer film by using the obtained pattern of the resist intermediate layer film as an etching mask; and etching the substrate by using the obtained pattern of the resist underlayer film as an etching mask to obtain a pattern on a substrate.

With the patterning process using a trilayer resist method as mentioned above, a fine pattern with high precision may be formed on a substrate.

In addition, the present invention provides a patterning process to form a pattern on a substrate by a lithography, comprising at least; forming a resist underlayer film on a substrate by the method for forming the resist underlayer film as mentioned above; forming an inorganic hard mask intermediate film selected from a silicon oxide film, a silicon nitride film, and a silicon oxynitride film on the resist underlayer film; forming a resist upperlayer film by using a composition for the resist upperlayer film consisting of a photoresist composition on the inorganic hard mask intermediate film; forming a resist pattern on the resist upperlayer film by development with a developer after exposing a pattern circuit region of the resist upperlayer film; etching the inorganic hard mask intermediate film by using the obtained resist pattern as an etching mask; etching the resist underlayer film by using the obtained pattern of the inorganic hard mask intermediate film as an etching mask; and etching the substrate by using the obtained pattern of the resist underlayer film as an etching mask to obtain a pattern on a substrate.

When an inorganic hard mask is formed as a resist intermediate layer film on a resist underlayer film by using the method of the present invention for forming a resist underlayer film, a resist underlayer film having a high heat resistance endurable a heat treatment at a high temperature in the formation of an inorganic hard mask intermediate film may be formed.

In addition, the present invention provides a patterning process to form a pattern on a substrate by a lithography, comprising at least; forming a resist underlayer film on a substrate by the method for forming the resist underlayer film as mentioned above; forming an inorganic hard mask intermediate film selected from a silicon oxide film, a silicon nitride film, and a silicon oxynitride film on the resist underlayer film; forming an organic anti-reflection film on the inorganic hard mask intermediate film; forming a resist upperlayer film by using a composition for the resist upperlayer film consisting of a photoresist composition on the organic anti-reflection film; forming a resist pattern on the resist upperlayer film by development with a developer after exposing a pattern circuit region of the resist upperlayer film; etching the organic anti-reflection film and the inorganic hard mask intermediate film by using the obtained resist pattern as an etching mask; etching the resist underlayer film by using the obtained pattern of the inorganic hard mask intermediate film as an etching mask; and etching the substrate by using the obtained pattern of the resist underlayer film as an etching mask to obtain a pattern on a substrate.

Accordingly, an organic anti-reflection film may be formed between an inorganic hard mask intermediate film and a resist upperlayer film.

The inorganic hard mask intermediate film is formed preferably by a CVD method or atomic layer deposition (ALD) method.

When the inorganic hard mask intermediate film is formed by a CVD method or an ALD method, a high etching resistance may be obtained.

It is preferable that the photoresist composition does not contain a polymer having a silicon atom. In addition, a step of etching the resist underlayer film by using the pattern of the inorganic hard mask intermediate film as an etching mask is carried out preferably by using an etching gas containing an oxygen gas or a hydrogen gas.

Accordingly, the inorganic hard mask containing a silicon atom has a resistance to etching by an oxygen gas or a hydrogen gas at the time of etching a resist underlayer film by using the pattern of the inorganic hard mask intermediate film as an etching mask.

The present invention provides a composition for forming a resist underlayer film, wherein the composition, which is a composition for forming a resist underlayer film of a multilayer resist film having at least three layers used in a lithography, comprising a resin represented by the following general formula (3) and having a weight-average molecular weight of 500 to 100,000,

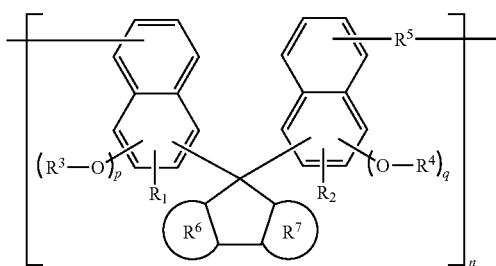

(3)

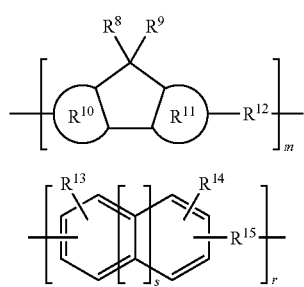

wherein $R^1$ and $R^2$ represent the same or a different hydrogen atom, a linear, a branched, or a cyclic alkyl group having 1 to 10 carbon atoms, an aryl group having 6 to 20 carbon atoms, or an alkenyl group having 2 to 20 carbon atoms; $R^3$ and $R^4$ each represents a hydrogen atom or a glycidyl group; $R^5$ represents a single bond, or a linear or a branched alkylene group having 1 to 10 carbon atoms; $R^6$ and $R^7$ represent a benzene ring or a naphthalene ring; each reference character p and q represents 1 or 2; $R^8$ and $R^9$ represent a hydrogen atom, a hydroxy group, an acyl group having 1 to 6 carbon atoms, an alkoxy group having 1 to 6 carbon atoms, an alkoxycarbonyl group having 1 to 6 carbon atoms, a carbonyl group, an amino group, an imino group, a hydroxy group substituted with an acid-labile or a glycidyl group, or a linear, a branched, or a cyclic alkyl group having 1 to 10 carbon atoms, an aryl group having 6 to 20 carbon atoms, an alkenyl group having 2 to 10 carbon atoms, or an alkynyl group having 2 to 10 carbon atoms; $R^{10}$ and $R^{11}$ represent a benzene ring or a naphthalene ring; $R^{13}$ and $R^{14}$ represent a hydrogen atom, a hydroxy group, or a linear, a branched, or a cyclic alkyl group having 1 to 10 carbon atoms, wherein $R^{13}$ and $R^{14}$ may be bonded to form a ring; $R^{12}$ and $R^{15}$ represent a linear or a branched alkylene group having 1 to 10 carbon atoms; reference character s represents 1 or 2; and each reference character n, m, and r satisfies $0<n<1.0$, $0\leq m<1.0$, $0\leq r<1.0$, and $0<m+r<1.0$.

When a resist underlayer film of a multilayer resist film is formed by using the composition for a resist underlayer film as mentioned above, a resist underlayer film having optimum n-value and k-value as an anti-reflection film and good gap filling characteristics, and an excellent etching resistance, high resistances to heat and solvent, especially without wiggling during substrate etching may be formed.

When the method for forming a resist underlayer film of a multilayer resist film having at least three layers or the composition for a resist underlayer film is used, as mentioned above, a resist underlayer film having optimum n-value and k-value as an anti-reflection film and good gap filling characteristics, an excellent etching resistance, and high resistances to heat and solvent, especially without wiggling during substrate etching in a high aspect line, which is thinner than 60 nm can be formed. In addition, when an inorganic hard mask is formed by a CVD method on a resist underlayer film formed by a spin coat method according to the present invention, a resist underlayer film having a high heat resistance endurable a heat treatment at a high temperature in the formation of an inorganic hard mask intermediate layer film, and thus a patterning process in which a resist underlayer film obtained by a spin coat method is combined with an inorganic hard mask obtained by a CVD method can be provided.

DETAILED DESCRIPTION OF THE PREFERRED EMBODIMENTS

Figure 1:
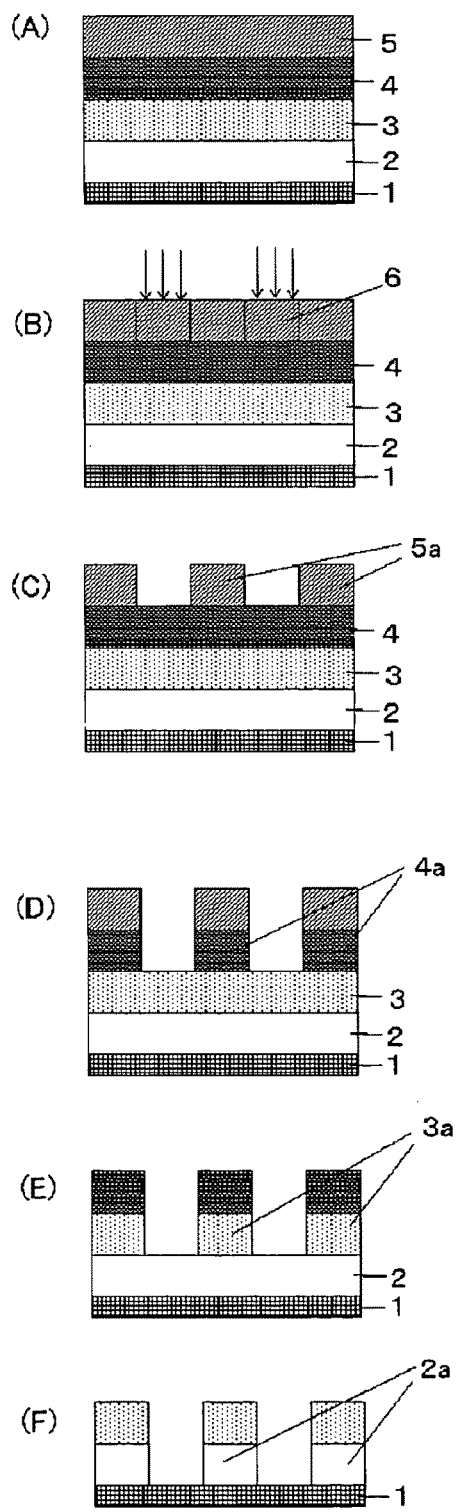
FIG. 1 is an explanatory drawing of a trilayer process.
Figure 2:
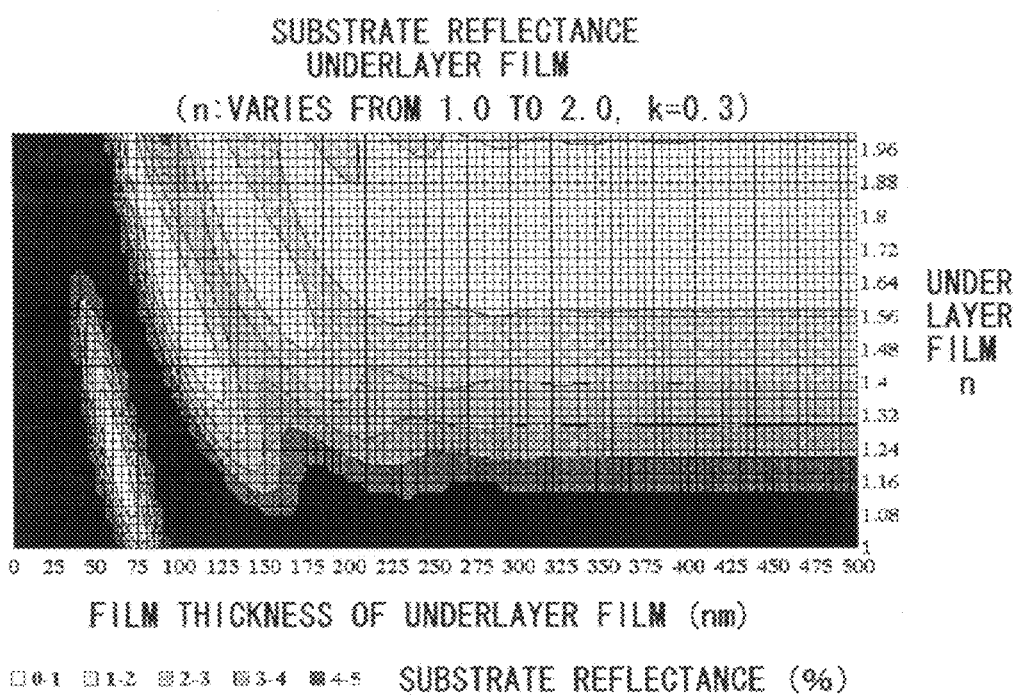
FIG. 2 is a graph showing a relationship between a substrate reflectance and a thickness of an underlayer film with a fixed refractive index k-value at 0.3 and a varying n-value from 1.0 to 2.0 in a bilayer process.
Figure 3:
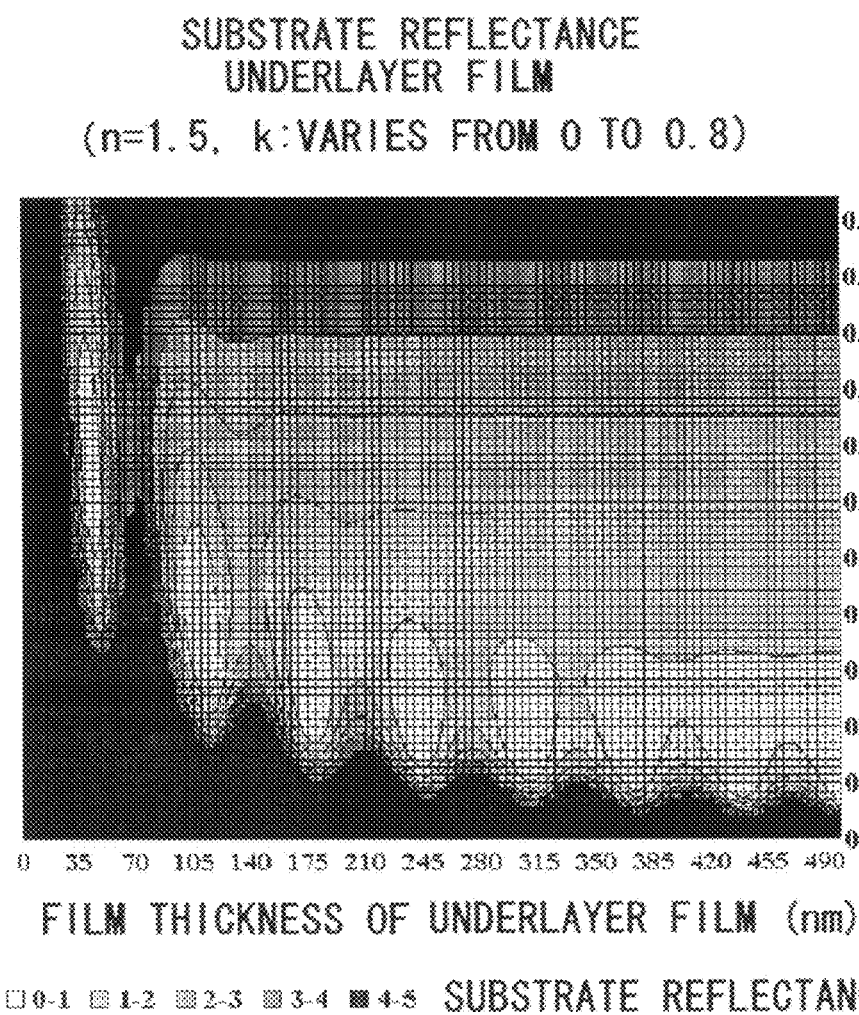
FIG. 3 is a graph showing a relationship between a substrate reflectance and a thickness of an underlayer film with a fixed refractive index n-value at 1.5 and a varying k-value from 0 to 0.8 in a bilayer process.
Figure 4:
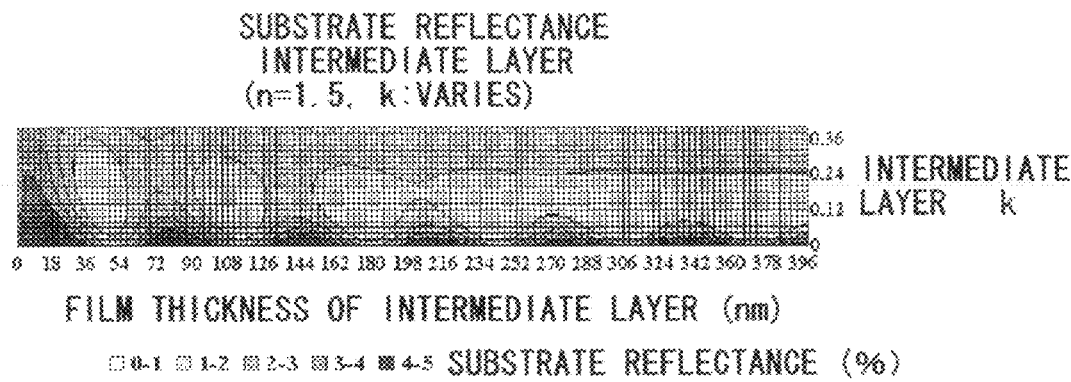
FIG. 4 is a graph showing a relationship between a substrate reflectance and a film thickness of an intermediate layer varying from 0 to 400 nm in a trilayer process, wherein an underlayer film has refractive index n-value and k-value, and a film thickness, fixed at 1.5, 0.6, and 500 nm, respectively, and the intermediate layer has a fixed n-value at 1.5 with varying a k-value from 0 to 0.3.
Figure 5:
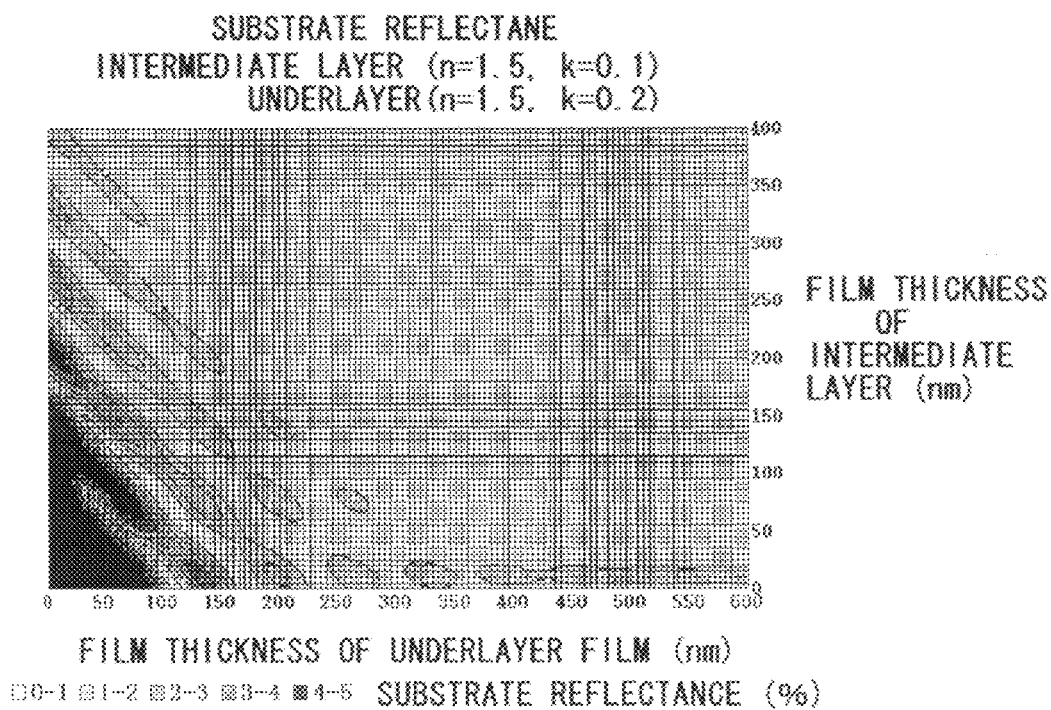
FIG. 5 is a graph showing a relationship among a substrate reflectance and varied film thicknesses of an underlayer and an intermediate layer in a trilayer process, wherein a refractive index n-value and k-value of the underlayer film are fixed at 1.5 and 0.2, respectively, and those of the intermediate layer at 1.5 and 0.1, respectively.
Figure 6:
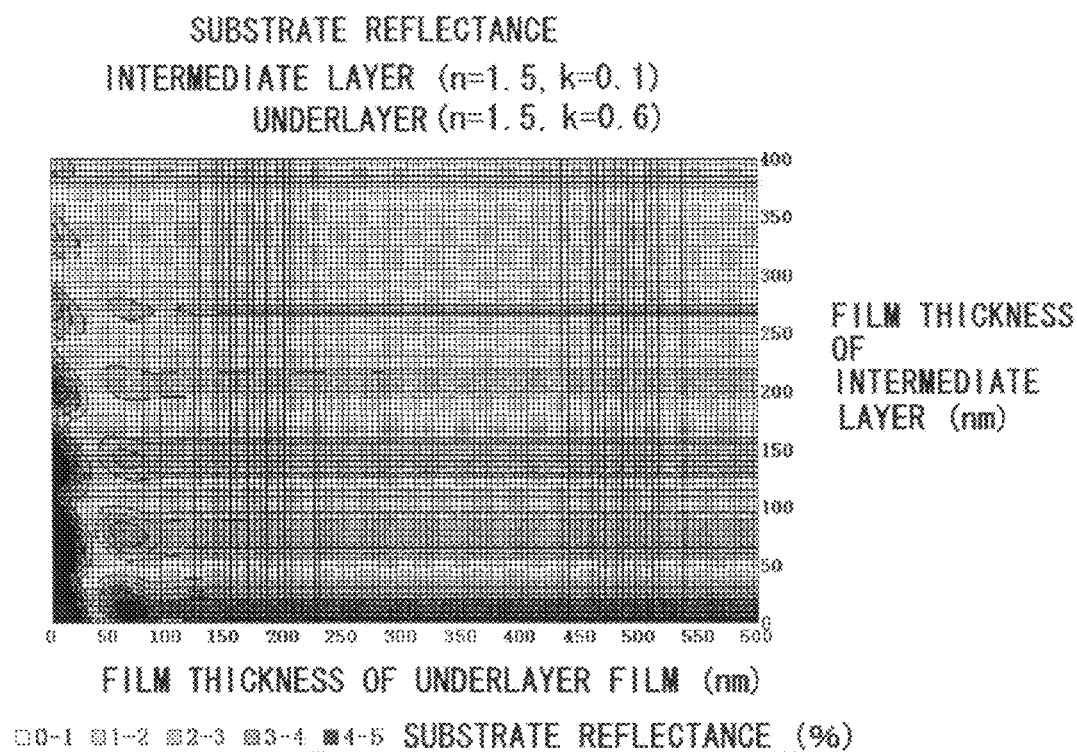
FIG. 6 is a graph showing a relationship among a substrate reflectance and varied film thicknesses of an underlayer and an intermediate layer in a trilayer process, wherein a refractive index n-value and k-value of the underlayer film are fixed at 1.5 and 0.6, respectively, and those of the intermediate layer fixed at 1.5 and 0.1, respectively.

Hereinbelow, the present invention will be explained more specifically.

As mentioned above, in a method for forming a resist underlayer film of a multilayer resist film having at least three layers, a method for forming a resist underlayer film having an excellent anti-reflection function, etching resistance, heat resistance, solvent resistance, and gap filling characteristics, especially without wiggling during substrate etching has been required. In addition, a composition for a resist underlayer film to form a resist underlayer film having an excellent anti-reflection function, heat resistance, and gap filling characteristics, especially excellent etching resistance without wiggling during substrate etching has been required.

Inventors of the present invention carried out an extensive investigation to achieve objectives as mentioned above, and as a result, found that a novolak resin of a bisnaphthol compound of a fluorene or of a benzofluorene has an extraordinary high heat resistance, and an evaporation of a solvent and so on can be facilitated when baked at high temperature above 300° C. without thermal decomposition of it. The inventors further found that the resin which is baked at above 300° C. become a promising composition for a resist underlayer film having a high carbon density and a compacting property, an improved etching resistance, and especially a high wiggling resistance of a fine pattern after etching.

Namely, the present invention provides a composition for a resist underlayer film of a trilayer resist film, containing (A) a novolak resin represented by the following general formula (1) formed by condensation of a bisnaphthol compound containing a fluorene or a benzofluorene, having a high etching resistance especially in a high energy beam with a wavelength of 300 nm or less, specifically an excimer laser of 248 nm, 193 nm, and 157 nm, a soft X-ray with a wavelength of 3 to 20 nm, an electron beam, and an X-ray, and a high transparency, as an essential component, and (B) an organic solvent, and optionally, in order to improve a spin coat property, a gap filling property of a nonplanar substrate, and a rigidity and a solvent resistance of a film, (C) a base polymer, (D) a crosslinking agent, and (E) an acid generator.

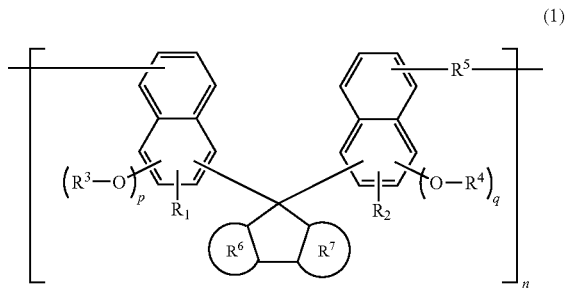

wherein $R^1$ and $R^2$ represent the same or a different hydrogen atom, a linear, a branched, or a cyclic alkyl group having 1 to 10 carbon atoms, an aryl group having 6 to 20 carbon atoms, or an alkenyl group having 2 to 20 carbon atoms; $R^3$ and $R^4$ each represents a hydrogen atom or a glycidyl group; $R^5$ represents a single bond, or a linear or a branched alkylene group having 1 to 10 carbon atoms; $R^6$ and $R^7$ represent a benzene ring or a naphthalene ring; each reference character p and q represents 1 or 2; and a reference character n is $0 < n \leq 1$.

Specific examples of the compound containing bisnaphthol group to obtain a novolak resin as represented by the general formula (1) include the following compounds.

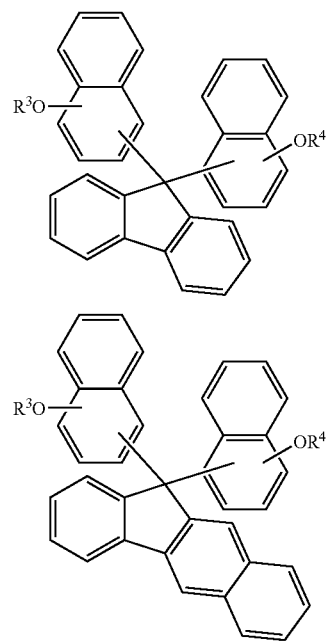

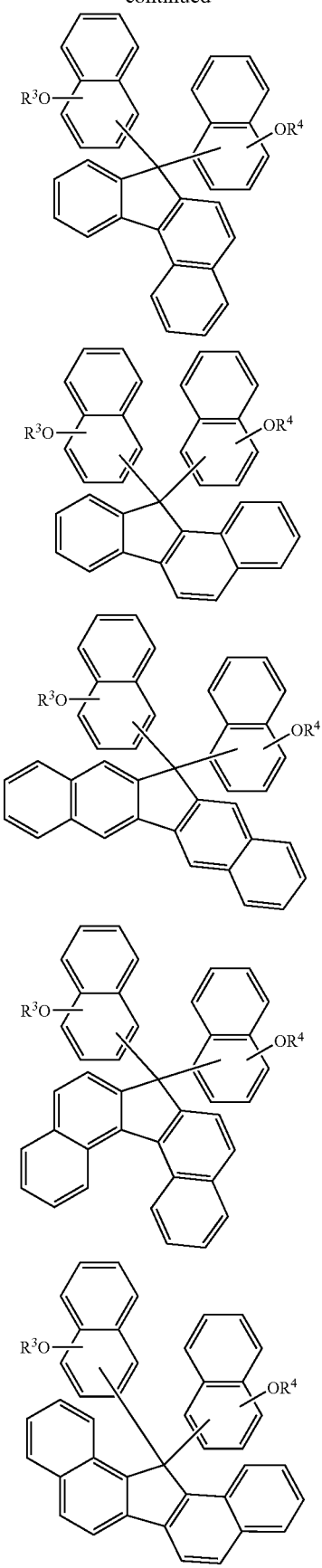

-continued

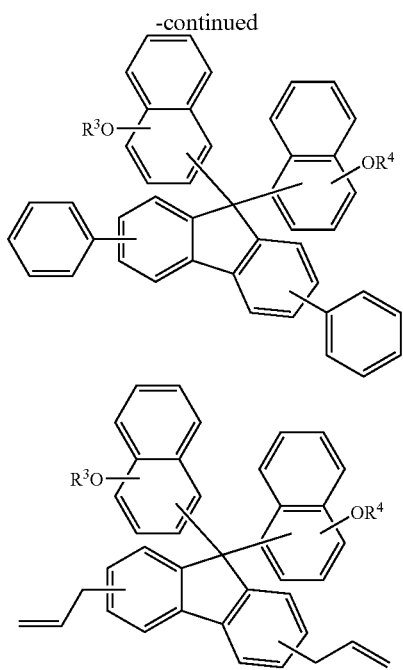

A fluorene bisphenol and a fluorene bisnaphthol have a caldo structure of a quaternary carbon atom thereby having an extraordinary high heat resistance. An inorganic hard mask intermediate layer film of a silicon oxide, a silicon nitride, a silicon oxynitride, or the like is formed on a resist underlayer film by a CVD method and the like at a high temperature, especially in a nitride-type film a temperature of above 300° C. is necessary, and thus a high heat resistance is required also as a resist underlayer film. Especially, an absorption at 193 nm of a fluorene bisnaphthol is relatively weak because an absorption is shifted toward a higher wavelength due to a naphthalene group, and thus an excellent anti-reflection effect may be expected in a trilayer process. In addition, inventors of the present invention found that a fluorene bisnaphthol has a higher etching resistance as compared with a fluorene bisphenol because a content of hydrogen atoms are reduced in proportion to an increase in the number of an aromatic group, and that, by baking at a temperature above 300° C., further high etching resistance and solvent resistance can be obtained and a pattern wiggling during a substrate etching can be suppressed.

Among the compounds mentioned above, a fluorene bisnaphthol having a hydrogen atom at $R^3$ and $R^4$ can be obtained by reacting a naphthol with a corresponding fluorenone by a conventional method, and a fluorene bisnaphthol having a glycidyl group at $R^3$ and $R^4$ can be obtained by introducing a glycidyl group to a hydroxy group of the naphthol compound thus obtained by a conventional method.

A composition for an underlayer film to be used in the patterning process of the present invention uses a novolak resin obtained by a condensation reaction of a bisnaphtol compound and an aldehyde. Examples of the aldehyde to be used here include formaldehyde, trioxane, paraform aldehyde, benzaldehyde, acetaldehyde, propyl aldehyde, phenyl acetaldehyde, α-phenylpropyl aldehyde, β-phenylpropyl aldehyde, o-hydroxy benzaldehyde, m-hydroxy benzaldehyde, p-hydroxy benzaldehyde, o-chloro benzaldehyde, m-chloro benzaldehyde, p-chloro benzaldehyde, o-nitro benzaldehyde, m-nitro benzaldehyde, p-nitro benzaldehyde, o-methyl benzaldehyde, m-methyl benzaldehyde, p-methyl benzaldehyde, p-ethyl benzaldehyde, p-n-butyl benzaldehyde, 1-naphthaldehyde, 2-naphthaldehyde, and furfural.

Among them, formaldehyde may be preferably used. These aldehydes may be used singly or in a combination of two or more kinds. The amount of the above-mentioned aldehyde to be used is preferably 0.2 to 5 mols and more preferably 0.5 to 2 mols, relative to 1 mol of a compound containing a bisnaphthol group.

In a condensation reaction of a bisnaphthol compound with an aldehyde, a catalyst may be used. Specific examples of the catalyst include an acid catalyst such as hydrochloric acid, nitric acid, sulfuric acid, formic acid, oxalic acid, acetic acid, methane sulfonic acid, camphor sulfonic acid, tosyl acid, and a trifluoromethane sulfonic acid.

The amount of these acid catalysts to be used is $1 \times 10^{-5}$ to $5 \times 10^{-1}$ mol relative to 1 mol of a bisnaphthol compound. An aldehyde is not necessary in the case of copolymerization of a compound having a non-conjugated double bond such as styrene, hydroxy styrene, vinyl naphthalene, hydroxy vinyl naphthalene, vinyl carbazole, vinyl anthracene, indene, hydroxy indene, benzofurane, hydroxy anthracene, acenaphthylene, biphenyl, bisphenol, trisphenol, dicyclopentadiene, tetrahydro indene, 4-vinyl cyclohexene, norbornadiene, 5-vinyl noborna-2-ene, α-pinene, β-pinene, and limonene.

In the polycondensation, water, methanol, ethanol, propanol, butanol, tetrahydrofurane, dioxane, or a mixture of them may be used as a reaction solvent. The amount of these solvents is 0 to 2,000 parts by mass relative to 100 parts by mass of reaction raw compositions.

Reaction temperature may be selected arbitrarily depending on a reactivity of raw compositions, but usually 10 to 200° C.

A polycondensation may be carried out by a method in which a bisnaphthol compound, an aldehyde, and a catalyst are charged all at once, or a bisnaphthol compound and an aldehyde are added gradually in the presence of a catalyst. After the polycondensation, in order to remove unreacted raw compositions, a catalyst, and the like remained in the system, a temperature of a reactor may be raised till 130 to 230° C. with reducing the pressure of the system to about 1 to 50 mmHg to remove volatile components.

A bisnaphthol compound represented by the above general formula (1) may be polymerized singly or copolymerized in a combination with another phenol compound. Examples of the copolymerizable phenol include phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphtyl phenol, 3-naphtyl phenol, 4-naphtyl phenol, 4-trityl phenol, resorcinol, 2-methyl resorcinol, 4-methyl resorcinol, 5-methyl resorcinol, cathecol, 4-t-butyl cathecol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, and isothymol.

Another copolymerizable monomer may be copolymerized, and specific examples of it include; 1-naphthol, 2-naphthol, 2-methyl-1-naphthol, 4-methoxy-1-naphthol, 7-methoxy-2-naphthol, dihydroxy naphthalene (such as 1,5-dihydroxy naphthalene, 1,7-dihydroxy naphthalene, and 2,6-dihydroxy naphthalene), methyl 3-hydroxy-naphthalene-2-carboxylate, 4-trityl phenol, indene, hydroxy indene, benzofurane, hydroxy anthracene, dihydroxy anthracene, trihydroxy anthracene, hydroxy pyrene, acenaphthylene, biphenyl, bisphenol, trisphenol, xylene, 1,2-dimethyl naphthalene, 1,3-dimethyl naphthalene, 1,4-dimethyl naphthalene, 1,5-dimethyl naphthalene, 1,6-dimethyl naphthalene, 1,7-dimethyl naphthalene, 1,8-dimethyl naphthalene, 2,3-dimethyl naphthalene, 2,6-dimethyl naphthalene, 2,7-dimethyl naphthalene, dicyclopentadiene, tetrahydroindene, 4-vinyl cyclohexene, norbornadiene, 5-vinylnorborna-2-ene, α-pinene, β-pinene, and limonene. A multicomponent copolymer of three or more components including a monomer mentioned above may also be used.

An aromatic compound and an aldehyde may be reacted, and co-condensed with the aromatic compound substituted with a hydroxymethyl group, an alkoxymethyl group, a halomethyl group, or the like. Specific examples of the aromatic compounds substituted with an alcohol such as a hydroxymethyl group and the like include dimethanol benzene, trimethanol benzene, dimethanol toluene, dimethanol ethyl benzene, dimethanol propyl benzene, dimethanol butyl benzene, dimethanol cyclohexyl benzene, dimethanol xylene, dimethanol mesitylene, naphthalene dimethanol, naphthalene trimethanol, methyl naphthalene dimethanol, ethyl naphthalene dimethanol, propyl naphthalene dimethanol, butyl naphthalene dimethanol, dimethyl naphthalene dimethanol, anthracene dimethanol, phenanthrene dimethanol, pyrene dimethanol, pentacene dimethanol, fluorene dimethanol, biphenyl dimethanol, bisnaphthalene dimethanol, fluoranthene dimethanol, indene dimethanol, acenaphthylene dimethanol, acenaphthene dimethanol, acenaphthenone dimethanol, acenaphthenequinone, indanone dimethanol, acephenanthrylene dimethanol, and aceanthrylene dimethanol. An alkoxymethyl-substituted aromatic compound is the above-mentioned compound whose hydroxymethyl group is substituted with an alkoxymethyl group, and a halomethyl-substituted aromatic compound is the above-mentioned compound whose hydroxymethyl group is substituted with a halomethyl group. In this case, an aldehyde is not necessary at the time of co-condensation.

A weight-average molecular weight (Mw) of the novolak resin converted to a molecular weight of polystyrene is preferably 1,000 to 30,000, in particular 2,000 to 20,000. A molecular weight distribution is preferably 1.2 to 7. A narrow molecular weight distribution cutting a monomer component, an oligomer component, or a low-molecular weight compound having a molecular weight (Mw) of 1,000 or less has a high crosslinking efficiency, thereby suppressing an evaporation of volatile components during baking, which, in turn, inhibiting a fouling near a baking cup.

Further, it is preferable that a composition for a resist underlayer film used in the method of the present invention for forming a resist underlayer film contain a resin represented by the following general formula (2) and having a weight-average molecular weight of 500 to 100,000, to further improve a etching resistance,

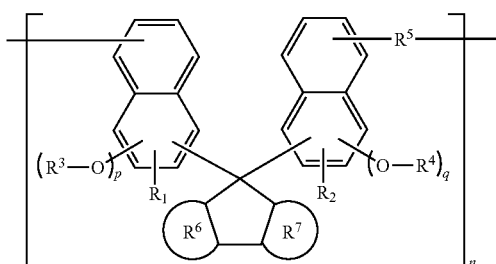

(2)

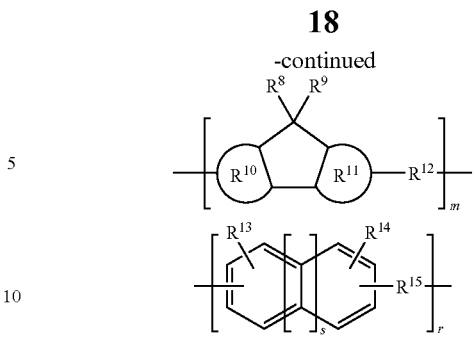

wherein $R^1$ to $R^7$, and reference characters p and q represent the same meaning as before; $R^8$ and $R^9$ represent a hydrogen atom, a hydroxy group, an acyl group having 1 to 6 carbon atoms, an alkoxy group having 1 to 6 carbon atoms, an alkoxycarbonyl group having 1 to 6 carbon atoms, a carbonyl group, an amino group, an imino group, a hydroxy group substituted with an acid-labile or a glycidyl group, or a linear, a branched, or a cyclic alkyl group having 1 to 10 carbon atoms, an aryl group having 6 to 20 carbon atoms, an alkenyl group having 2 to 10 carbon atoms, or an alkynyl group having 2 to 10 carbon atoms; $R^{10}$ and $R^{11}$ represent a benzene ring or a naphthalene ring; $R^{13}$ and $R^{14}$ represent a hydrogen atom, a hydroxy group, or a linear, a branched, or a cyclic alkyl group having 1 to 10 carbon atoms, wherein $R^{13}$ and $R^{14}$ may be bonded to form a ring; $R^{12}$ and $R^{15}$ represent a linear or a branched alkylene group having 1 to 10 carbon atoms; reference character s represents 1 or 2; and each reference character n, m, and r satisfies $0<n<1.0$, $0\leq m<1.0$, $0\leq r<1.0$, and $0<m+r<1.0$.

Namely, when a composition containing a resin represented by the above general formula (2), which is obtained by copolymerizing, in addition to a repeating unit "n" in the above general formula (1), a repeating unit "m" and/or a repeating unit "r", and having a weight-average molecular weight of 500 to 100,000 is used, an etching resistance may be further increased.

Then, substituent of a condensed aromatic group or an alicyclic group may be introduced at an ortho position to a hydroxy group of a novolak resin obtained after condensation by using an acid catalyst.

Here, specific examples of an introducible substituent include the following groups.

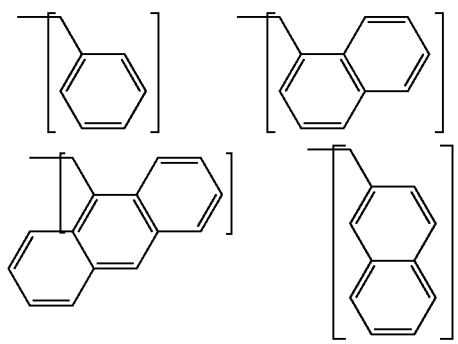

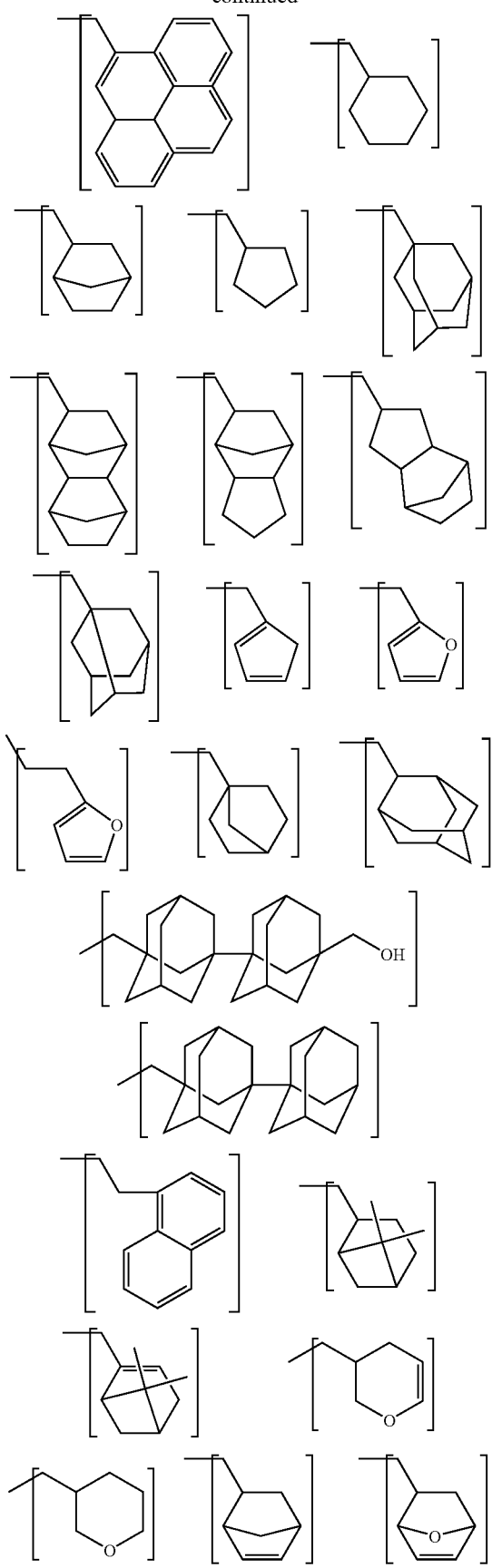
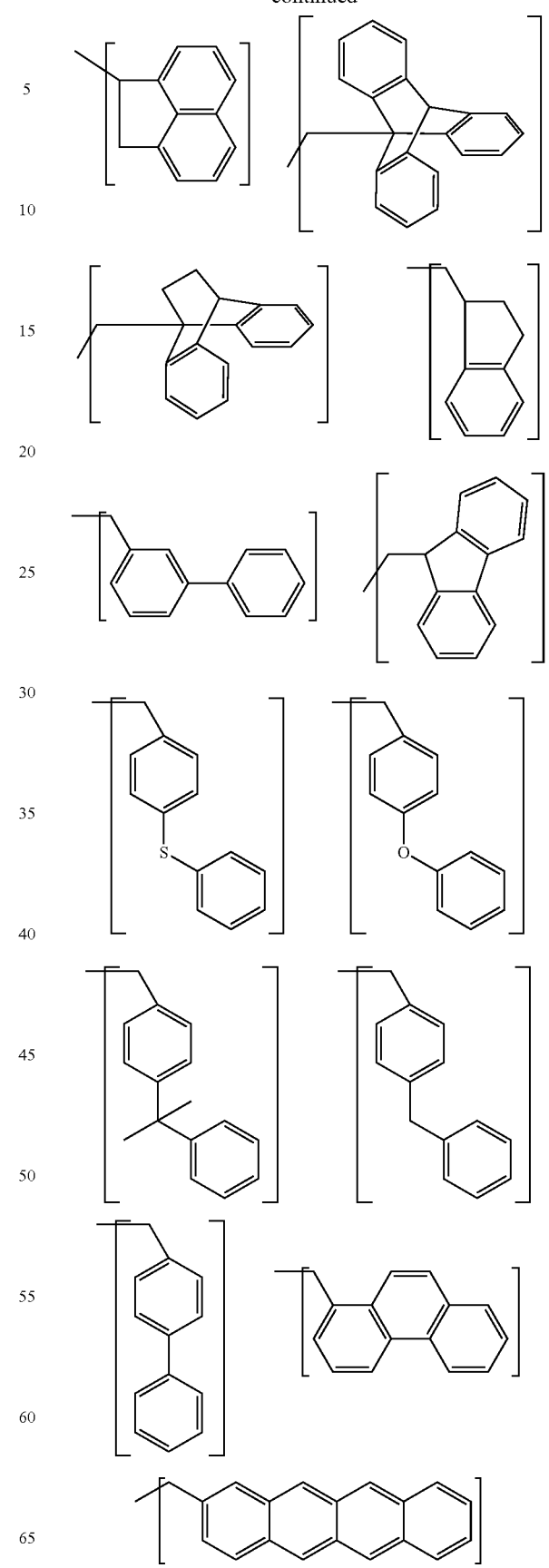

-continued

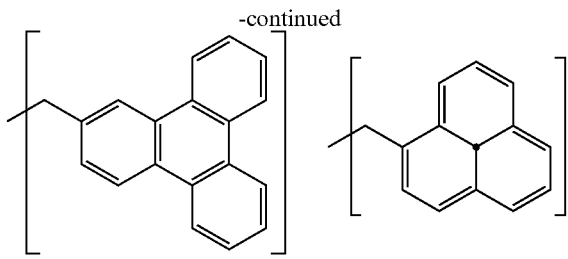

Among them, a polycyclic aromatic group such as an anthracene methyl group and a pyrene methyl group are most preferably used for a 248-nm exposure. To increase a transparency at 193 nm, a compound having an alicyclic structure or a naphthalene structure is preferably used. On the other hand, a benzene ring has a window to improve a transparency at 157 nm, and thus it is necessary to increase an absorption by shifting an absorption wavelength. A furane ring has a slightly increased absorption at 157 nm as its absorption shifts to a shorter wavelength side relative to a benzene ring, but its effect is small. A naphthalene ring, an anthracene ring, and a pyrene ring increase absorption by shifting an absorption wavelength to a longer wavelength side and these aromatic rings have an effect to improve an etching resistance, and thus they are preferably used.

As a method to introduce a substituent, an alcohol, wherein a bonding position of the afore-mentioned substituent is a hydroxy group, is introduced to a polymer after polymerization at an ortho or a para position to a hydroxy group of a naphthol in the presence of an acid catalyst. Examples of the acid catalyst to be used include an acid catalyst such as hydrochloric acid, nitric acid, sulfuric acid, formic acid, oxalic acid, acetic acid, methane sulfonic acid, n-butane sulfonic acid, camphor sulfonic acid, tosyl acid, and a trifluoromethane sulfonic acid. The amount of these acid catalyst to be used is $1 \times 10^{-5}$ to $5 \times 10^{-1}$ mols relative to 1 mol of a phenol compound. An introduced amount of the substituent is 0 to 0.8 mols relative to 1 mol of a hydroxy group of a naphthol.

In order to improve a transparency at 193 nm of a novolak resin represented by the general formula (1) formed from a compound containing a bisnaphthol group, in the present invention, hydrogenation may be done on it. A hydrogenation rate of its aromatic group is preferably 80% or less by mol and in particular 60% or less by mol.

In addition, it may be blended with another polymer. The polymer for blending is mixed with a novolak resin represented by the general formula (1) formed from a compound having a naphthol group, and has a responsibility to improve film formation properties by spin coating and ga filling characteristics of a nonplanar substrate.

A composition having a high carbon density and etching resistance is selected. Examples of the composition include novolak resin of phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphtyl phenol, 3-naphtyl phenol, 4-naphtyl phenol, 4-trityl phenol, resorcinol, 2-methyl resorcinol, 4-methyl resorcinol, 5-methyl resorcinol, cathecol, 4-t-butyl cathecol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol, 4,4'-(9H-fluorene-9-ylidene)bisphenol, 2,2'-dimethyl-4,4'-(9H-fluorene-9-ylidene)bisphenol, 2,2'-diallyl-4,4'-(9H-fluorene-9-ylidene)bisphenol, 2,2'-difluoro-4,4'-(9H-fluorene-9-ylidene)bisphenol, 2,2'-diphenyl-4,4'-(9H-fluorene-9-ylidene)bisphenol, 2,2'-dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxy naphthalene (such as 1,5-dihydroxy naphthalene, 1,7-dihydroxy naphthalene, and 2,6-dihydroxy naphthalene), methyl 3-hydroxy-naphthalene-2-carboxylate, indene, hydroxy indene, benzofurane, hydroxy anthracene, acenaphthylene, biphenyl, bisphenol, trisphenol, dicyclopentadiene, tetrahydroindene, 4-vinyl cyclohexene, norbornadiene, 5-vinylnorborna-2-ene, α-pinene, β-pinene, limonene, and the like; polyhydroxy styrene, polystyrene, polyvinyl naphthalene, polyvinyl anthracene, polyvinyl carbazole, polyindene, polyacenaphthylene, polynorbornene, polycyclodecene, polytetracyclododecene, polynortricyclene, poly(meth)acrylate, and their copolymers.

In addition, a nortricyclene copolymer described in Japanese Patent Laid-Open (kokai) No. 2004-205658, a hydrogenated naphthol novolak resin described in Japanese Patent Laid-Open (kokai) No. 2004-205676, a naphthol dicyclopendadiene copolymer described in Japanese Patent Laid-Open (kokai) No. 2004-205685, a phenol dicyclopentadiene copolymer described in Japanese Patent Laid-Open (kokai) Nos. 2004-354554 and 2005-10431, a fluorene bisphenol novolak described in Japanese Patent Laid-Open (kokai) No. 2005-128509, an acenaphthylene copolymer described in Japanese Patent Laid-Open (kokai) No. 2005-250434, an indene copolymer described in Japanese Patent. Laid-Open (kokai) No. 2006-53543, a phenol-group containing fullerene described in Japanese Patent Laid-Open (kokai) No. 2006-227391, a bisphenol compound and its novolak resin described in Japanese Patent Laid-Open (kokai) Nos. 2006-259249, 2006-293298, and 2007-316282, a dibisphenol compound and its novolak resin described in Japanese Patent Laid-Open (kokai) No. 2006-259482, a novolak resin of an adamantane phenol compound described in Japanese Patent Laid-Open (kokai) No. 2006-285095, a hydroxyvinylnaphthalene copolymer described in Japanese Patent Laid-Open (kokai) No. 2007-171895, a bisnaphthol compound and its novolak resin described in Japanese Patent Laid-Open (kokai) No. 2007-199653, ROMP described in Japanese Patent Laid-Open (kokai) No. 2008-26600, and a tricyclopentadiene copolymer described in Japanese Patent Laid-Open (kokai) No. 2008-96684 may also be blended.

An amount of the polymer for blending is 0 to 1,000 parts by mass and preferably 0 to 500 parts by mass, relative to 100 parts by mass of a novolak resin represented by the general formula (1).

A monomer component to be used for condensation may also be added to a novolak resin in a composition for an underlayer film formation used in a patterning process of the present invention. This addition of a monomer component has a merit in that gap filling characteristics may be improved without changing an optical constant. An amount to be added is 0 to 1,000 parts by mass and preferably 0 to 500 parts by mass relative to 100 parts by mass of a novolak resin. The adding amount may be controlled appropriately with observing gap filling characteristics. Too much of an added monomer component may form an outing gas during baking to form particles, which, in turn, may foul a baking oven. Accordingly, the adding amount needs to be as little as possible to secure gap filling characteristics.

One performance requirement for a resist underlayer film having an anti-reflection function is that there is no intermixing with a silicon-containing resist intermediate layer film and a resist upperlayer film, which are formed over the resist underlayer film, and no diffusion of a low-molecular weight component into a resist upperlayer film and to a resist intermediate layer film (Proc. SPIE, Vol. 2195, p. 225-229 (1994)). To prevent such phenomena from occurring, a thermal crosslinking is generally done by baking an anti-reflection film after being coated by a spin coat method. Accordingly, when a crosslinking agent is added as a component of a composition for an anti-reflection film, a crosslinking substituent is introduced into the polymer in a certain case. Even in the case that a crosslinker is not added particularly, a fluorene bisnaphthol novolak resin may be crosslinking agent by heating at a temperature of over 300° C. according to the reaction mechanism, which will be explained later.

An indanone may be condensed in a presence of an acid to form a truxene. If there is an indanone, an acenaphthenone, or a fluorenone as a repeating unit, a crosslinking by a condensation reaction takes place by an acid or a heat. This condensation reaction is a dehydration condensation, and thus a carbon ratio is increased and this, in turn, improves an etching resistance of a film after the crosslinking by the condensation reaction.

A bisnaphthol novolak resin containing a fluorene group or a benzofluorene group used in the present invention of a method for forming a resist underlayer film has a very high heat resistance, and thus practically there is no decomposition by baking it at a high temperature over 300° C. Inventors of the present invention further found that, in this fluorene- or benzofluorene-containing bisnaphthol novolak resin, evaporation of a solvent and the like is facilitated by a high-temperature baking over 300° C. thereby increasing a carbon density and a compacting property of the film and this, in turn, improves an etching resistance. In addition, the inventors found that a baking at a temperature over 300° C. renders a high solvent resistance and inhibits wiggling, which occurs during substrate etching. A high-temperature baking of a composition having a low heat resistance at a temperature over 300° C. induces a thermal decomposition, which does not necessarily increase a carbon density but rather results in deterioration of it in a certain case.

A crosslinker usable in the present invention may be those described in paragraphs 0055 to 0060 of Japanese Patent Laid-Open (kokai) No. 2007-199653.

In the present invention, an acid generator to further facilitate a thermal crosslinking reaction may be added. There are acid generators generating an acid by a thermal decomposition or a light exposure, and any of them may be added. Specifically, those compositions described in paragraphs 0061 to 0085 of Japanese Patent Laid-Open (kokai) No. 2007-199653 may be added.

Further, to a composition for a resist underlayer film used in the present invention of a method for forming a resist underlayer film, a basic compound to improve a storage stability may be blended. A basic compound acts as an acid-quencher to inhibit a crosslinking reaction caused by a minute amount of an acid generated from an acid generator.

Specifically, basic compounds described in paragraphs 0086 to 0090 of Japanese Patent Laid-Open (kokai) No. 2007-199653 may be added.

An organic solvent usable in a composition for a resist underlayer film used in the present invention of a method for forming a resist underlayer film is not particularly limited as far as it can dissolve a base polymer, an acid-generator, a crosslinking agent, and other additives, as mentioned above. Specifically, those solvents described in paragraphs 0091 to 0092 of Japanese Patent Laid-Open (kokai) No. 2007-199653 may be added.

In a composition for a resist underlayer film used in a patterning process of the present invention, a surfactant may also be added in order to improve an coating performance in spin coating. Those surfactants described in paragraphs 0165 to 0166 of Japanese Patent Laid-Open (kokai) No. 2008-111103 may be used.

A patterning process of the present invention comprises; coating a composition for a photoresist underlayer film containing a novolak resin represented by the general formula (1) obtained by condensing a bisnaphtol compound having a fluorene or a benzofluorene on a substrate; forming a resist underlayer film by baking at a high temperature over 300° C.; forming a resist upperlayer film of a photoresist composition on the resist underlayer film via a resist intermediate layer film; exposing an intended region of the photoresist layer by a radiation beam and the like; forming a resist pattern by developing by a developer; etching a resist intermediate layer film by using the photoresist pattern obtained by a dry etching machine as a mask; and processing the resist underlayer film and the substrate by using the obtained pattern of the resist intermediate layer film as a mask.

A composition for a resist underlayer film used in a patterning process of the present invention is coated on a substrate to be processed by a spin coat method and the like, similarly to a photoresist. A spin coat method and the like may ensure good gap filling characteristics. After spin coating, a solvent is evaporated, and then baking is done to facilitate a crosslinking reaction thereby prohibiting a mixing with a resist upperlayer film and a resist intermediate layer film from occurring. Baking is done at a temperature above 300° C. and 600° C. or lower and with a time of 10 to 600 seconds, preferably 10 to 300 seconds. A more preferable baking temperature is 350 or more to 500° C. or less. In view of effects on device damage and wafer deformation, the highest temperature allowed for heating in a lithography wafer process is 600° C. or lower, preferably 500° C. or lower.

As described in the afore-mentioned SPIE Vol. 469 (1984), p. 72, a novolak resin generates a phenoxy radical by heating and this, in turn, activates a methylene group of a novolak bond to make bonds among the methylene groups for crosslinking. This reaction is a radical reaction, not forming a liberated molecule, so that there is no film shrinkage by crosslinking if the composition has a high heat resistance.

A baking atmosphere may be an air, but in order to reduce an oxygen gas, sealing with an inert gas such as $N_2$, Ar, and He is preferable to inhibit oxidation of a resist underlayer film. In order to inhibit the oxidation, an oxygen gas concentration needs to be controlled, preferably at 1,000 ppm or less, more preferably 100 ppm or less. If a resist underlayer film is oxidized during baking, the case may happen that an absorption is increased or an etching resistance is decreased, which is not preferable.

A thickness of the resist underlayer film is selected arbitrarily, but preferably 30 to 20,000 nm, in particular 50 to 15,000 nm. After the resist underlayer film is formed, on it a resist intermediate layer film containing a silicon atom and a resist upperlayer film not containing a silicon atom may be formed in a trilayer process.

In the case when an inorganic hard mask intermediate layer film is formed on a resist underlayer film, a silicon oxide film, a silicon nitride film, or a silicon oxynitride film (SiON film) may be formed by a CVD method, an ALD method, or the like. A method for forming a nitride film is described in Japanese Patent Laid-Open (kokai) No. 2002-334869 and WO2004/066377. A film thickness of the inorganic hard mask is 5 to 200 nm, preferably 10 to 100 nm. Among them, a SiON film, having the highest effect as an anti-reflection film, is most preferably used. A temperature of a substrate becomes 300 to 500° C. when a SiON film is formed, and thus an underlayer film needs to be resistant to a temperature of 300 to 500° C. A composition for a resist underlayer film containing a novolak resin represented by the general formula (1) obtained by condensation of a bisnaphthol compound having a fluorene or a benzofluorene used in the present invention has a high heat resistance endurable a high temperature of 300 to 500° C. Accordingly, a combination of an inorganic hard mask formed by a CVD method or an ALD method and a resist underlayer film formed by a spin coat method is possible.

On a resist intermediate layer film as mentioned above, a photoresist film may be formed as a resist upperlayer film. However, it may also be allowed to form an organic anti-reflection film (BARC) on a resist intermediate layer film by a spin coat method, and on it a photoresist film. When a SiON film is used as a resist intermediate layer film, reflection may be suppressed even with a high NA of over 1.0 in an immersion exposure, because of two anti-reflection films of a SiON film and a BARC film. One another merit of forming a BARC film is that there is an effect to reduce footing of a photoresist pattern just above a SiON film.

As a silicon-containing resist intermediate layer film in a trilayer process, an intermediate layer film based on a polysilsesquioxane is also used preferably. Reflection may be suppressed by rendering an anti-reflection effect to the resist intermediate layer film. Especially in a 193 nm exposure, a k-value are increased, and a substrate reflection too, are increased when a composition containing many aromatic groups thereby having a high substrate etching resistance is used as a resist underlayer film. However, a substrate reflection may be suppressed to 0.5% or less when a reflection is suppressed by a resist intermediate layer film. As a preferably used resist intermediate layer film having an effective anti-reflection property, there may be mentioned an anthracene for an exposure at 248 nm or 157 nm, and, for an exposure at 193 nm, a polysilsesquioxane, which has a pendant of a light-absorbing group having a phenyl group or a silicon-silicon bond and undergoes a crosslinking by an acid or a heat.

In formation of a silicon-containing resist intermediate layer film, a spin coat method is preferable to a CVD method in view of merits in simplicity and economy.

A resist upperlayer film in a trilayer resist film may be any of a positive type and a negative type, and a photoresist composition as same as those generally used may be used. When a monolayer resist upperlayer film is formed by using the above-mentioned photoresist composition, a spin coat method is preferably used as in the case of forming the above-mentioned resist underlayer film. A photoresist composition is coated by a spin coat method and then pre-baked, preferably at 60 to 180° C. and for 10 to 300 seconds. Thereafter, an exposure, a post-exposure bake (PEB), and a development are performed in conventional manners to obtain a resist pattern. A thickness of the resist upperlayer film is not particularly restricted, but is preferably 30 to 500 nm, in particular 50 to 400 nm.

As an exposure light, a high energy beam with a wavelength of 300 nm or shorter, specifically excimer lasers of 248 nm, 193 nm, and 157 nm, a soft X-ray of 3-20 nm, an electron beam, an X-ray, and the like may be used.

Then, etching is done by using the obtained resist pattern as a mask. In a trilayer process, etching of a resist intermediate layer film, especially an inorganic hard mask, is done with a flon gas by using the resist pattern as a mask. Then, a resist underlayer film is etched with an oxygen gas or a hydrogen gas as mentioned above by using a pattern of the resist intermediate layer film, especially a pattern of the inorganic hard mask, as a mask.

A subsequent etching of a substrate to be processed may be done in a conventional method. For example, a substrate of SiO, SiN, or a silicon-based low dielectric constant insulator film is etched by a gas mainly formed of a flon gas, and that of p-Si, Al, or W is etched by a gas mainly formed of a chlorine gas or a bromine gas. When a substrate processing is done by etching with a flon gas, a silicon-containing intermediate layer is delaminated simultaneously with the substrate processing in a trilayer process. When a substrate is etched with a chlorine gas or a bromine gas, a delamination of a silicon-containing intermediate layer needs to be done separately by dry etching with a flon gas after a substrate processing.

A resist underlayer film formed by the present invention of a method for forming a resist underlayer film is characterized by an excellent etching resistance of these substrates to be processed.

As a substrate to be processed, a layer to be processed is formed on a substrate. The substrate is not particularly restricted, and compositions different from those of a substrate to be processed including Si, α-Si, p-Si, $SiO_2$, SiN, SiON, W, TiN, and Al may be used. As the layer to be processed, a Low-k film and its stopper film, such as Si, $SiO_2$, SiON, SiN, p-Si, α-Si, W, W—Si, Al, Cu, and Al—Si may be used, and formed in a thickness of usually 50 to 10,000 nm, in particular 100 to 5,000 nm.

A composition for a resist underlayer film of the present invention contains a resin represented by the following general formula (3) and having a weight-average molecular weight of 500 to 100,000.

By copolymerizing a repeating unit "m" and/or a repeating unit "r", in addition to a repeating unit "n" which renders an excellent anti-reflection effect, a high heat resistance, and the like, a further excellent etching resistance, especially a resist underlayer film without wiggling during substrate etching may be formed. By controlling a weight-average molecular weight at 500 to 100,000, crosslinking efficiency is increased, thereby leading to inhibiting a fouling near a baking cup by suppressing evaporation of volatile components during baking.

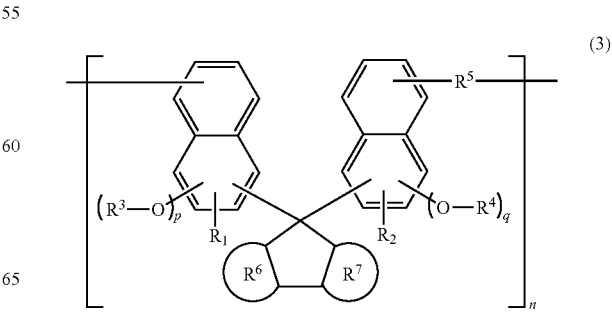

(3)

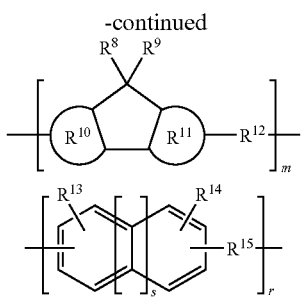

wherein $R^1$ and $R^2$ represent the same or a different hydrogen atom, a linear, a branched, or a cyclic alkyl group having 1 to 10 carbon atoms, an aryl group having 6 to 20 carbon atoms, or an alkenyl group having 2 to 20 carbon atoms; $R^3$ and $R^4$ each represents a hydrogen atom or a glycidyl group; $R^5$ represents a single bond, or a linear or a branched alkylene group having 1 to 10 carbon atoms; $R^6$ and $R^7$ represent a benzene ring or a naphthalene ring; each reference character p and q represents 1 or 2; $R^8$ and $R^9$ represent a hydrogen atom, a hydroxy group, an acyl group having 1 to 6 carbon atoms, an alkoxy group having 1 to 6 carbon atoms, an alkoxycarbonyl group having 1 to 6 carbon atoms, a carbonyl group, an amino group, an imino group, a hydroxy group substituted with an acid-labile or a glycidyl group, or a linear, a branched, or a cyclic alkyl group having 1 to 10 carbon atoms, an aryl group having 6 to 20 carbon atoms, an alkenyl group having 2 to 10 carbon atoms, or an alkynyl group having 2 to 10 carbon atoms; $R^{10}$ and $R^{11}$ represent a benzene ring or a naphthalene ring; $R^{13}$ and $R^{14}$ represent a hydrogen atom, a hydroxy group, or a linear, a branched, or a cyclic alkyl group having 1 to 10 carbon atoms, wherein $R^{13}$ and $R^{14}$ may be bonded to form a ring; $R^{12}$ and $R^{15}$ represent a linear or a branched alkylene group having 1 to 10 carbon atoms; reference character s represents 1 or 2; and each reference character n, m, and r satisfies $0<n<1.0$, $0\leq m<1.0$, $0\leq r<1.0$, and $0<m+r<1.0$.

An example of the trilayer process is specifically shown by FIG. 1.

In the trilayer process, as shown in FIG. 1(A), after a resist underlayer film 3 is formed on a layer to be processed 2 laminated on a substrate 1, a resist intermediate layer film 4 is formed, and then, on it a resist upperlayer film 5 is formed.

Thereafter, as shown in FIG. 1(B), an intended part 6 of the resist upperlayer film is light-exposed, and then subjected to PEB and development to form a resist pattern 5a (FIG. 1(C)). The resist intermediate layer film 4 is etched by using the obtained resist pattern 5a as a mask with a CF gas to form a pattern of the resist intermediate layer film 4a (FIG. 1(D)). After the resist pattern 5a is removed, the resist underlayer film 3 is etched by using this obtained pattern of the resist intermediate layer film 4a as a mask with an oxygen plasma to obtain a resist underlayer film pattern 3a (FIG. 1(E)). Then, after the pattern of the resist intermediate layer film 4a is removed, the layer to be processed 2 is etched by using the resist underlayer film pattern 3a as a mask (FIG. 1(F)).

In the case of forming an inorganic hard mask intermediate film, the resist intermediate layer film 4 is the inorganic hard mask intermediate film, and in the case of forming BARC, the BARC layer is formed between the resist intermediate layer film 4 and the resist upperlayer film 5. Etching of BARC may be done continuously prior to etching of the resist intermediate layer film 4, or etching of the resist intermediate layer film 4 may be done with a different etching instrument and the like after etching of only BARC is done.

Here, a molecular weight was measured specifically as following.

A weight-average molecular weight (Mw) and a number-average molecular weight (Mn) relative to polystyrene were measured by a gel permeation chromatography (GPC), and then dispersivity (Mw/Mn) was obtained.

EXAMPLES

Hereinbelow, the present invention will be explained specifically by Examples and Comparative Examples, but the present invention is not restricted by them.

Synthesis Examples

Polymers 1 to 22 and Comparative Polymers 1 to 3

Synthesis Example 1

Into a 300-mL flask were added 291 g of fluorene bisnaphthol, 75 g of 37% aqueous formalin solution, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed by under reduced pressure, and then water and unreacted monomers were removed by reducing the pressure of the system to 2 mmHg at 150° C. to obtain Polymer 1.

Molecular weight (Mw) and dispersivity (Mw/Mn) were obtained from GPC, and a ratio of components in the polymer was obtained from $^1$H-NMR-analysis. The results are as shown below:

Polymer 1: Mw 3,500, Mw/Mn 4.50

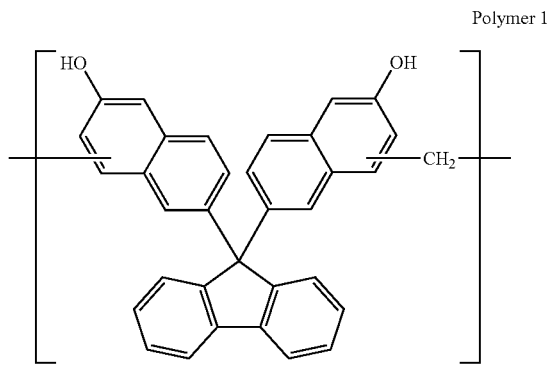

Polymer 1

Synthesis Example 2

Into a 300-mL flask were added 320 g of benzo[c]fluorene bisnaphthol, 75 g of 37% aqueous formalin solution, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 2.

Molecular weight (Mw) and dispersivity (Mw/Mn) were obtained from GPC, and a ratio of components in the polymer was obtained from $^1$H-NMR analysis. The results are as shown below:

Polymer 2: Mw 3,100, Mw/Mn 4.80

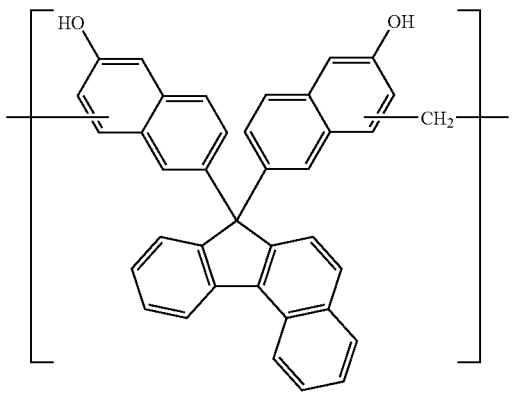

Polymer 2

Synthesis Example 3

Into a 300-mL flask were added 320 g of benzo[b]fluorene bisnaphthol, 75 g of 37% aqueous formalin solution, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 3.

Molecular weight (Mw) and dispersivity (Mw/Mn) were obtained from GPC, and a ratio of components in the polymer was obtained from ¹H-NMR analysis. The results are as shown below:

Polymer 3: Mw 2,600, Mw/Mn 5.10

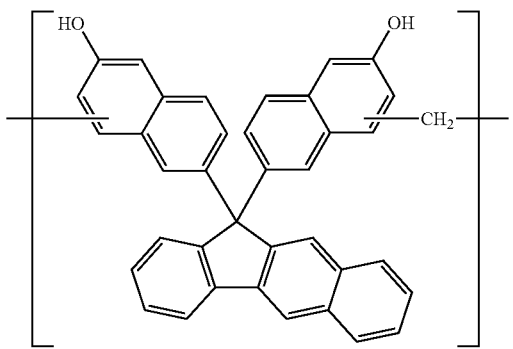

Polymer 3

Synthesis Example 4

Into a 300-mL flask were added 145 g of fluorene bisnaphthol, 108 g of trityl-4-phenol, 75 g of 37% aqueous formalin solution, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 4.

Molecular weight (Mw) and dispersivity (Mw/Mn) were obtained from GPC, and a ratio of components in the polymer was obtained from ¹H-NMR analysis. The results are as shown below:

Polymer 4: Mw 3,600, Mw/Mn 4.80

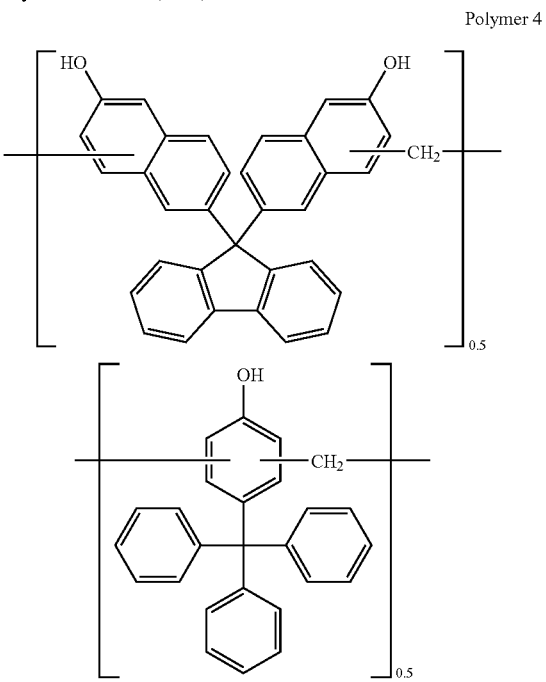

Polymer 4

Synthesis Example 5

Into a 300-mL flask were added 145 g of fluorene bisnaphthol, 109 g of 1-hydroxypyrene, 75 g of 37% aqueous formalin solution, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 5.

Molecular weight (Mw) and dispersivity (Mw/Mn) were obtained from GPC, and a ratio of components in the polymer was obtained from ¹H-NMR analysis. The results are as shown below:

Polymer 5: Mw 3,200, Mw/Mn 5.40

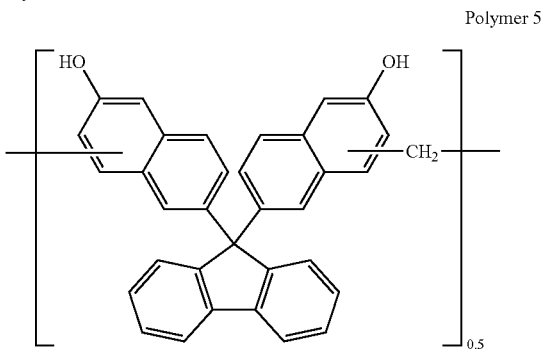

Polymer 5

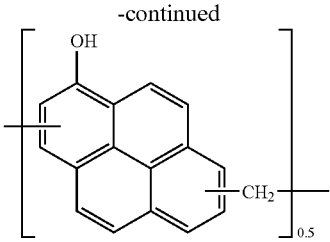

Synthesis Example 6

Into a 300-mL flask were added 145 g of fluorene bisnaphthol, 96 g of fluorene dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 6.

Molecular weight (Mw) and dispersivity (Mw/Mn) were obtained from GPC, and a ratio of components in the polymer was obtained from $^1$H-NMR analysis. The results are as shown below:

Polymer 6: Mw 6,200, Mw/Mn 6.40

Polymer 6

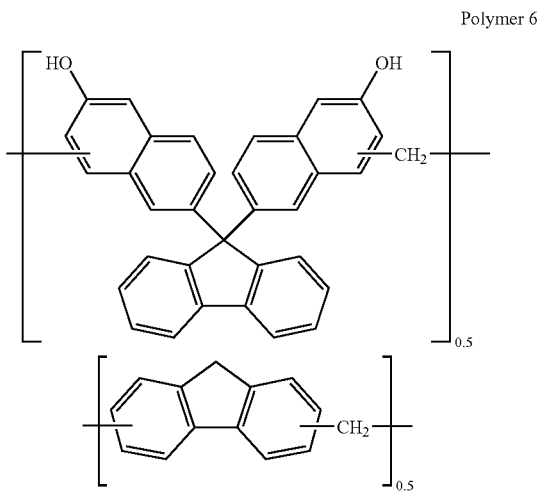

Synthesis Example 7

Into a 300-mL flask were added 145 g of fluorene bisnaphthol, 100 g of fluorenone dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 7.

Molecular weight (Mw) and dispersivity (Mw/Mn) were obtained from GPC, and a ratio of components in the polymer was obtained from $^1$H-NMR analysis. The results are as shown below:

Polymer 7: Mw 6,100, Mw/Mn 5.80

Polymer 7

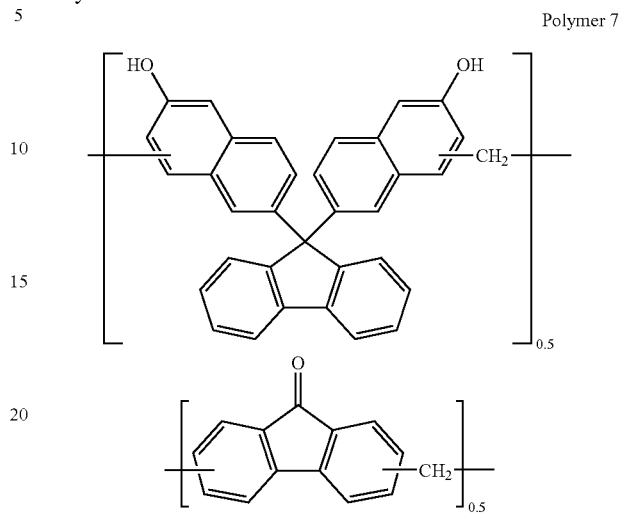

Synthesis Example 8

Into a 300-mL flask were added 145 g of fluorene bisnaphthol, 96 g of naphthalene-2,6-dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system till 2 mmHg at 150° C. to obtain Polymer 8.

Molecular weight (Mw) and dispersivity (Mw/Mn) were obtained from GPC, and a ratio of components in the polymer was obtained from $^1$H-NMR analysis. The results are as shown below:

Polymer 8: Mw 9,300, Mw/Mn 5.90

Polymer 8

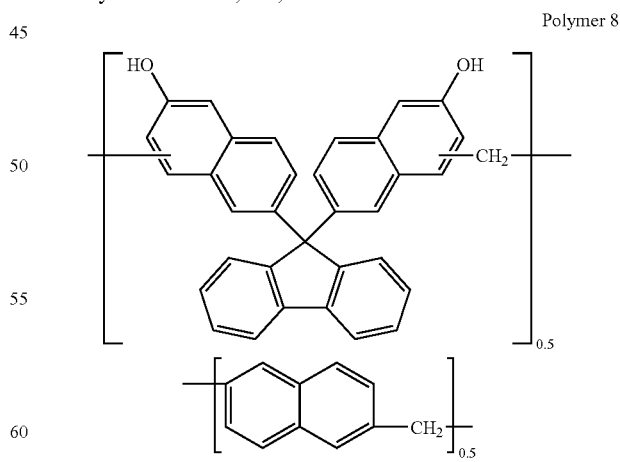

Synthesis Example 9

Into a 300-mL flask were added 145 g of fluorene bisnaphthol, 120 g of 9-benzylidene fluorenone dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 9.

Molecular weight (Mw) and dispersivity (Mw/Mn) were obtained from GPC, and a ratio of components in the polymer was obtained from $^1$H-NMR analysis. The results are as shown below:

Polymer 9: Mw 5,400, Mw/Mn 5.20

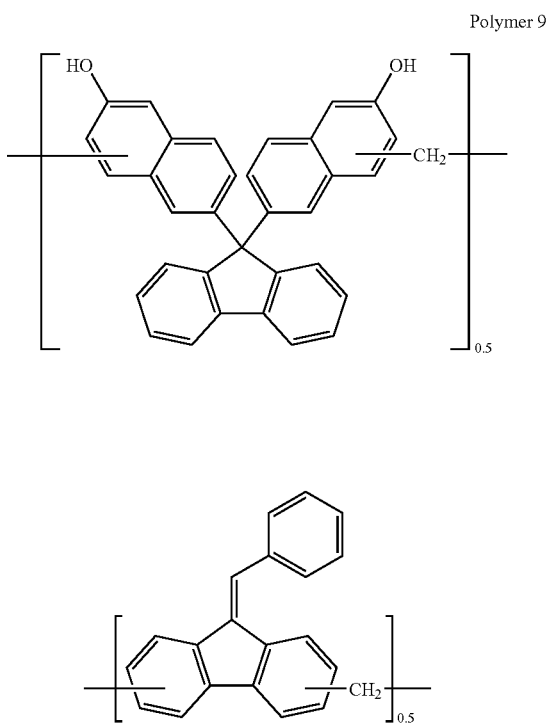

Synthesis Example 10

Into a 300-mL flask were added 145 g of fluorene bisnaphthol, 123 g of benzo[b]fluorene dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 10.

Molecular weight (Mw) and dispersivity (Mw/Mn) were obtained from GPC, and a ratio of components in the polymer was obtained from $^1$H-NMR analysis. The results are as shown below:

Polymer 10: Mw 4,600, Mw/Mn 5.90

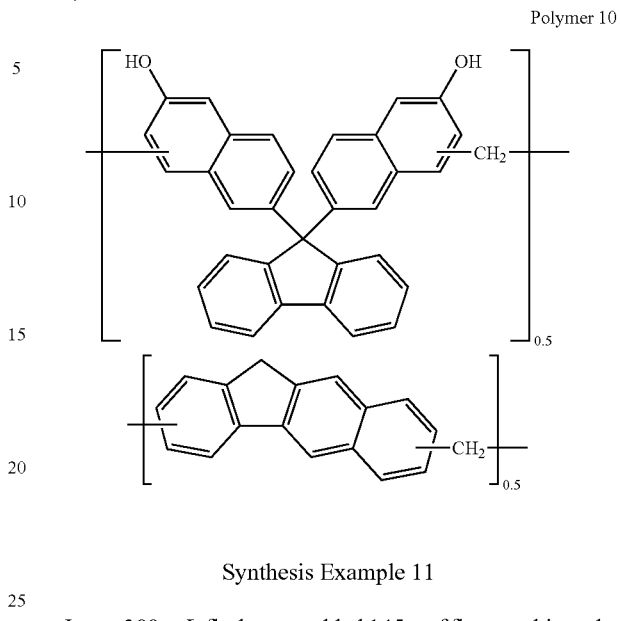

Synthesis Example 11

Into a 300-mL flask were added 145 g of fluorene bisnaphthol, 113 g of acenaphthene dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 11.

Molecular weight (Mw) and dispersivity (Mw/Mn) were obtained from GPC, and a ratio of components in the polymer was obtained form $^1$H-NMR analysis. The results are as shown below:

Polymer 11: Mw 4,200, Mw/Mn 5.50

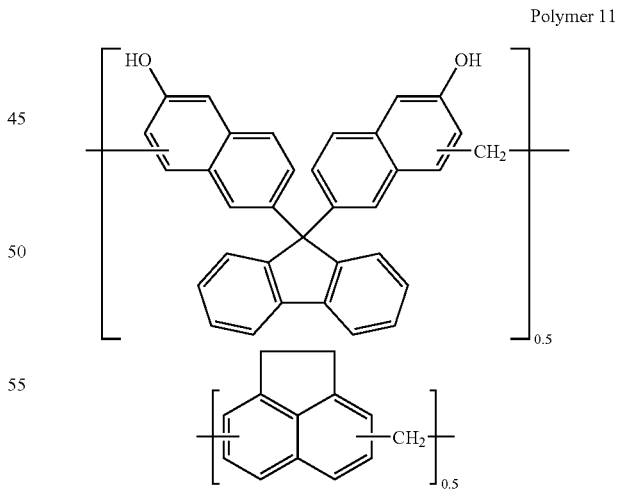

Synthesis Example 12

Into a 300-mL flask were added 145 g of fluorene bisnaphthol, 25 g of benzene dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 12.

Molecular weight (Mw) and dispersivity (Mw/Mn) were obtained from GPC, and a ratio of components in the polymer was obtained from $^1$H-NMR analysis. The results are as shown below:

Polymer 12: Mw 6,900, Mw/Mn 7.50

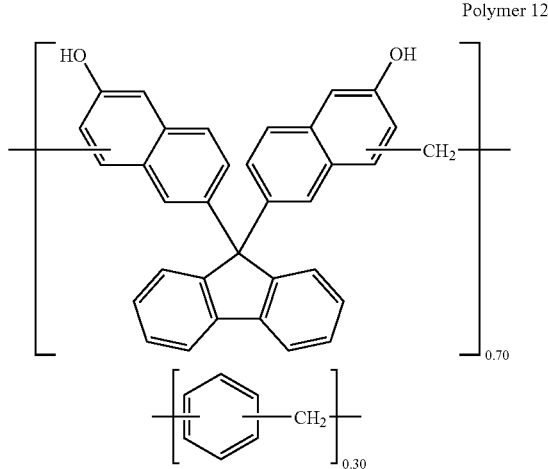

Polymer 12

Synthesis Example 13

Into a 300-mL flask were added 145 g of fluorene bisnaphthol, 98 g of biphenyl-4,4'-dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 13.

Molecular weight (Mw) and dispersivity (Mw/Mn) were obtained from GPC, and a ratio of components in the polymer was obtained from $^1$H-NMR analysis. The results are as shown below:

Polymer 13: Mw 4,500, Mw/Mn 4.90

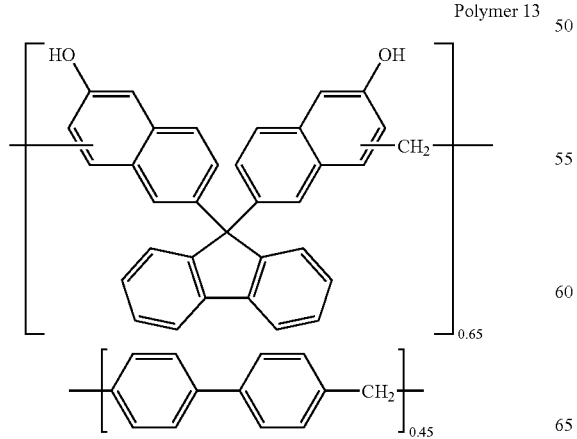

Polymer 13

Synthesis Example 14

Into a 300-mL flask were added 145 g of fluorene bisnaphthol, 35 g of 1-naphthol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 14.

Molecular weight (Mw) and dispersivity (Mw/Mn) were obtained from GPC, and a ratio of components in the polymer was obtained from $^1$H-NMR analysis. The results are as shown below:

Polymer 14: Mw 3,600, Mw/Mn 4.30

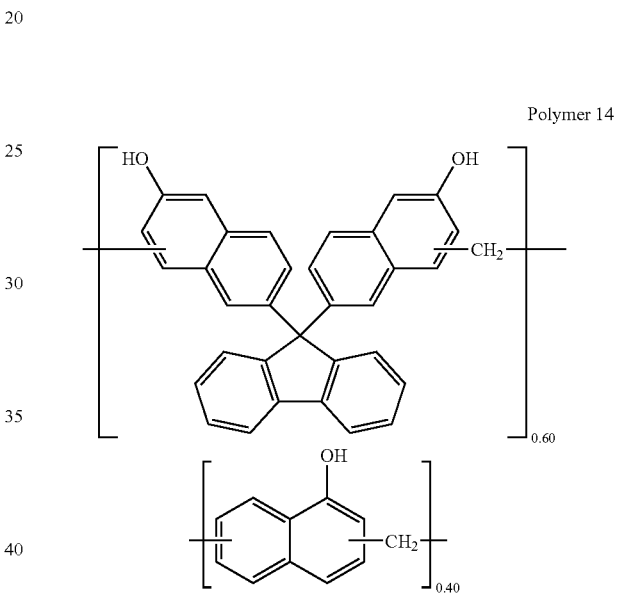

Polymer 14

Synthesis Example 15

Into a 300-mL flask were added 145 g of fluorene bisnaphthol, 119 g of acenaphthenone dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 15.

Molecular weight (Mw) and dispersivity (Mw/Mn) were obtained from GPC, and a ratio of components in the polymer was obtained from $^1$H-NMR analysis. The results are as shown below:

Polymer 15: Mw 4,100, Mw/Mn 5.60

Polymer 15

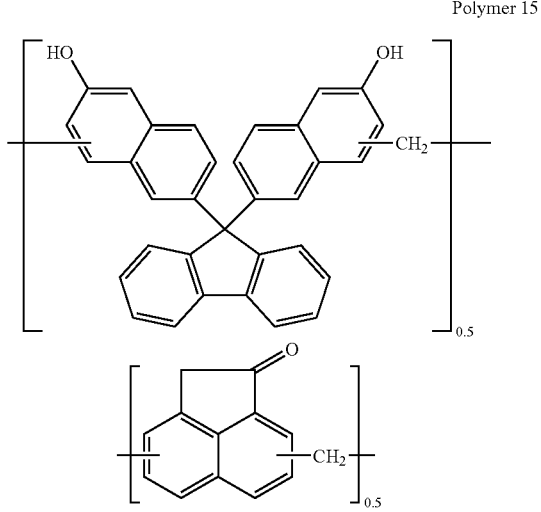

Synthesis Example 16

Into a 300-mL flask were added 145 g of fluorene bisnaphthol, 89 g of indanone dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 16.

Molecular weight (Mw) and dispersivity (Mw/Mn) were obtained from GPC, and a ratio of components in the polymer was obtained from $^1$H-NMR analysis. The results are as shown below:
Polymer 16: Mw 4,300, Mw/Mn 5.30

Polymer 16

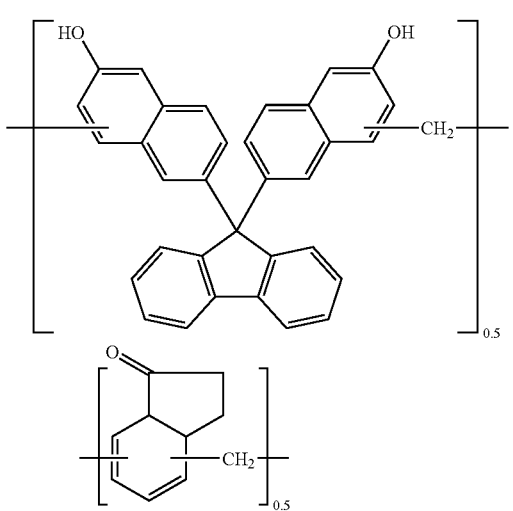

Synthesis Example 17

Into a 300-mL flask were added 145 g of fluorene bisnaphthol, 42 g of 1-hydroxy anthracene, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 17.

Molecular weight (Mw) and dispersivity (Mw/Mn) were obtained from GPC, and a ratio of components in the polymer was obtained from $^1$H-NMR analysis. The results are as shown below:
Polymer 17: Mw 3,200, Mw/Mn 4.90
Polymer 17

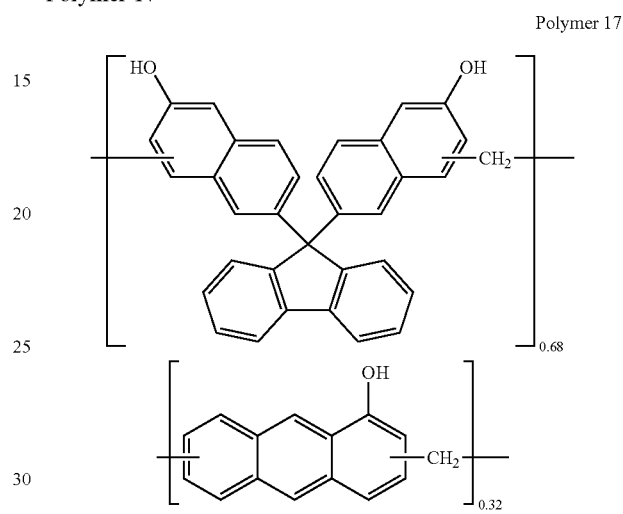

Synthesis Example 18

Into a 300-mL flask were added 145 g of fluorene bisnaphthol, 86 g of 4-hydroxy-3-indanone, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 18.

Molecular weight (Mw) and dispersivity (Mw/Mn) were obtained from GPC, and a ratio of components in the polymer was obtained from $^1$H-NMR analysis. The results are as shown below:
Polymer 18: Mw 4,300, Mw/Mn 5.30

Polymer 18

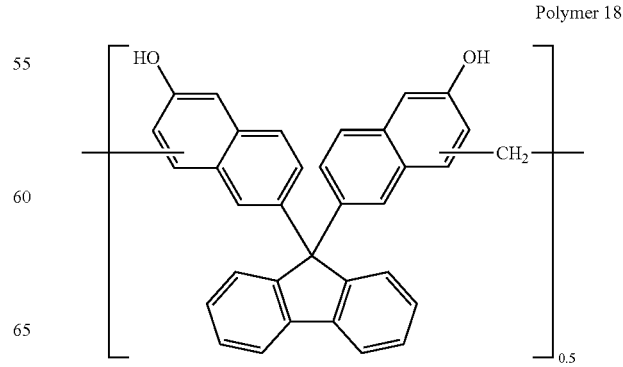

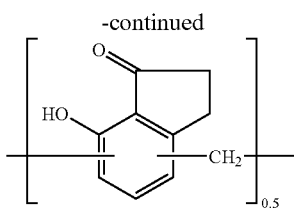

Synthesis Example 19

Into a 300-mL flask were added 145 g of fluorene bisnaphthol, 53 g of anthracene-9,19-dimethanol, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 19.

Molecular weight (Mw) and dispersivity (Mw/Mn) were obtained from GPC, and a ratio of components in the polymer was obtained from $^1$H-NMR analysis. The results are as shown below:

Polymer 19: Mw 5,900, Mw/Mn 6.33

Polymer 19

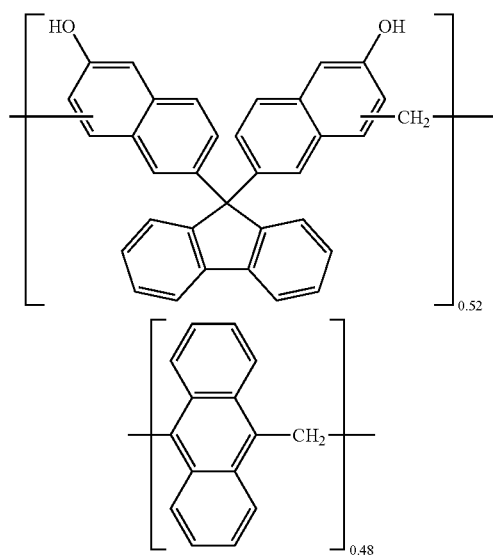

Synthesis Example 20

Into a 300-mL flask were added 145 g of fluorene bisnaphthol, 46 g of 1,8-hydroxy anthracene, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Polymer 20.

Molecular weight (Mw) and dispersivity (Mw/Mn) were obtained from GPC, and a ratio of components in the polymer was obtained from $^1$H-NMR analysis. The results are as shown below:

Polymer 20: Mw 3,900, Mw/Mn 4.80

Polymer 20

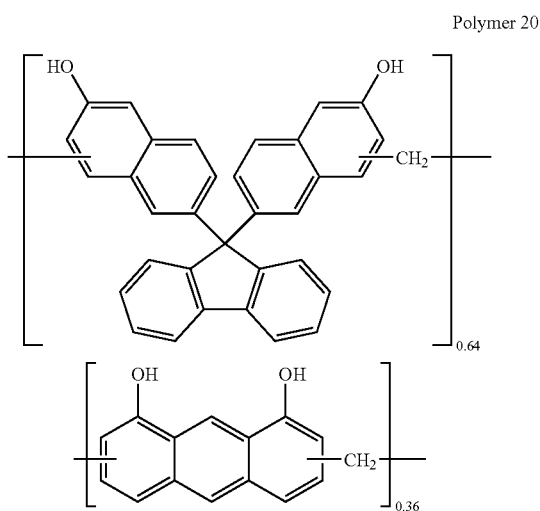

Synthesis Example 21

Into a 300-mL flask were added 120 g of Polymer 1 and 41 g of 9-anthracene methanol, and they were dissolved in THF solvent, and 0.5 g of tosyl acid were added to there, and then they were heated with stirring at 100° C. for 24 hours. After the reaction, the resulting mixture was washed by water to remove a catalyst and metallic impurities. The THF solvent was removed under reduced pressure to obtain Polymer 21.

Molecular weight (Mw) and dispersivity (Mw/Mn) were obtained from GPC, and a ratio of components in the polymer was obtained from $^1$H-NMR analysis. The results are as shown below:

Polymer 21: Mw 4,300, Mw/Mn 4.50

Polymer 21

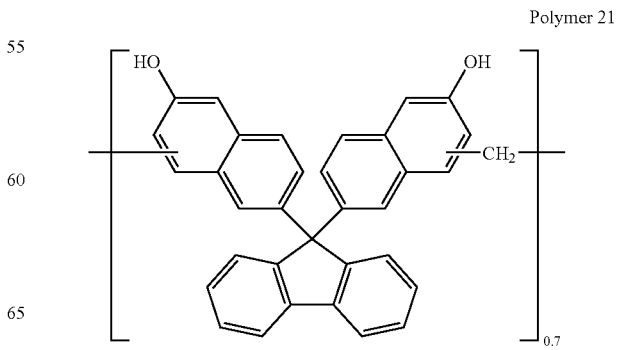

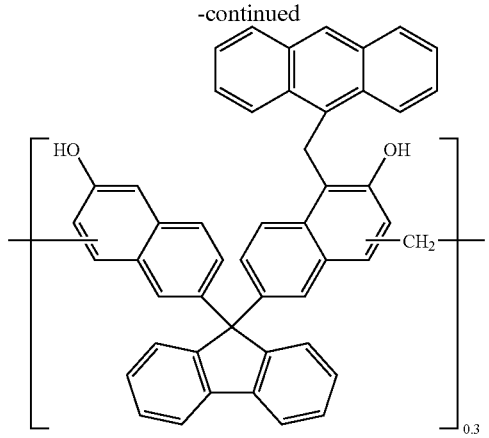

Synthesis Example 22

Into a 300-mL flask were added 120 g of Polymer 1 and 49 g of 1-pyrene methanol, and they were dissolved in THF solvent, and 0.5 g of tosyl acid were added to there, and then they were heated with stirring at 80° C. for 24 hours. After the reaction, the resulting mixture was washed by water to remove a catalyst and metallic impurities. The THF solvent was removed under reduced pressure to obtain Polymer 22.

Molecular weight (Mw) and dispersivity (Mw/Mn) were obtained from GPC, and a ratio of components in the polymer was obtained from $^1$H-NMR analysis. The results are as shown below:

Polymer 22: Mw 4,500, Mw/Mn 4.50

Polymer 22

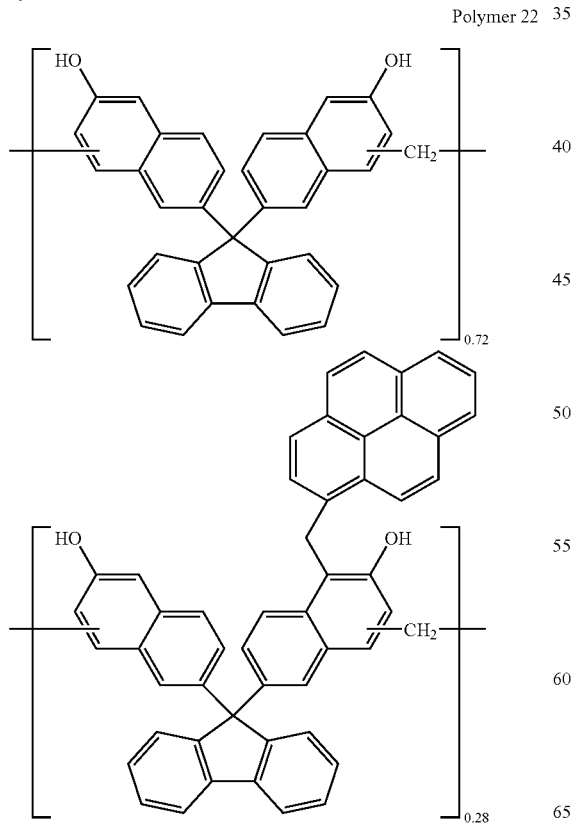

Comparative Synthesis Example 1

Into a 300-mL flask were added 200 g of fluorene bisphenol, 75 g of 37% aqueous formalin solution, and 5 g of oxalic acid, and then they were heated with stirring at 100° C. for 24 hours. After the reaction, the resulting mixture was dissolved in 500 mL of methyl isobutyl ketone, and then washed thoroughly by water to remove a catalyst and metallic impurities. The solvent was removed under reduced pressure, and then water and unreacted monomers were removed by reducing the pressure of the system to 2 mmHg at 150° C. to obtain Comparative Polymer 1.

Molecular weight (Mw) and dispersivity (Mw/Mn) were obtained from GPC, and a ratio of components in the polymer was obtained from $^1$H-NMR analysis. The results are as shown below:

Comparative Polymer 1: Mw 6,500, Mw/Mn 5.20

Comparative Polymer 1

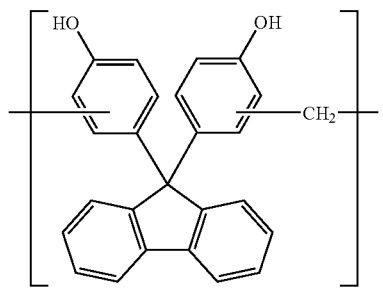

As Comparative Polymer 2, m-cresol novolak resin with Mw 8,800 and Mw/Mn 4.5, and, as Comparative Polymer 3, polyhydroxy styrene with Mw 9,200 and Mw/Mn 1.05 were used.

Preparation of a Composition for a Resist Underlayer Film and a Composition for a Resist Intermediate Layer Film (UDL-1 to UDL-25, Comparative Examples UDL-1 to UDL-3, and SOG-1)

As shown in Table 1, a resin (Polymers 1 to 22 as shown above), a resin (Comparative Example Polymers 1 to 3 as shown above), an ArF silicon-containing intermediate layer Polymer 1, an acid generator shown by AG1, and a crosslinking agent shown by CR1 were dissolved in a solvent containing 0.1% by mass of FC-4430 (manufactured by Sumitomo 3M Ltd.) in the ratio shown in Table 1. The resulting mixture was filtered through a 0.1 μm filter made of a fluorinated polymer to obtain a composition for a resist underlayer film (UDL-1 to UDL-25 and Comparative Examples UDL-1 to UDL-3) and a composition for a resist intermediate layer film (SOG-1), respectively. AG1 used as an acid generator, CR1 used as a crosslinking agent, and an ArF silicon-containing intermediate layer Polymer 1 are shown below.

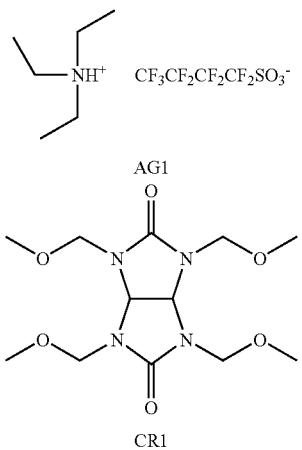

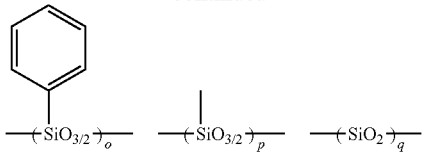

ArF silicon-containing intermediate layer polymer 1
(o = 0.20, p = 0.50, q = 0.30 Mw = 3,400)

Measurement of Refractive Index

An above-mentioned composition for a resist underlayer film (UDL-1 to UDL-25 and Comparative Examples UDL-1 to UDL-3) was coated on a silicon substrate and baked at 350° C. for 60 seconds to form a resist underlayer film with a film thickness of 200 nm. A composition for a resist intermediate layer film (SOG-1) was coated on a silicon substrate and baked at 200° C. for 60 seconds to obtain a silicon-containing resist intermediate layer film with a film thickness of 35 nm. Each refractive index (n and k) of a resist underlayer film and of a resist intermediate layer film was obtained by using a spectroscopic ellipsometer with a variable incidence angle (VASE, manufactured by J. A. Woollam Japan Co., Ltd.) at a wavelength of 193 nm. The results are shown in Table 1.

TABLE 1

| No. | Polymer (parts by mass) | Crosslinking agent (parts by mass) | Acid generator (parts by mass) | Solvent (parts by mass) | Refractive index (193 nm) n-value | k-value |
|---|---|---|---|---|---|---|
| UDL-1 | Polymer 1 (30) | — | — | PGMEA (100) | 1.31 | 0.44 |
| UDL-2 | Polymer 2 (30) | — | — | Cyclohexanone(100) | 1.35 | 0.38 |
| UDL-3 | Polymer 3 (30) | — | — | Cyclohexanone(100) | 1.34 | 0.37 |
| UDL-4 | Polymer 4 (30) | — | — | Cyclohexanone(100) | 1.36 | 0.52 |
| UDL-5 | Polymer 5 (30) | — | — | Cyclohexanone(100) | 1.42 | 0.46 |
| UDL-6 | Polymer 1 (30) | CR1 (5) | AG1 (1) | PGMEA (100) | 1.36 | 0.42 |
| UDL-7 | Polymer 6 (30) | — | — | Cyclohexanone(100) | 1.31 | 0.44 |
| UDL-8 | Polymer 7 (30) | — | AG1 (1) | Cyclohexanone(100) | 1.35 | 0.38 |
| UDL-9 | Polymer 8 (30) | — | — | Cyclohexanone(100) | 1.34 | 0.37 |
| UDL-10 | Polymer 9 (30) | — | — | Cyclohexanone(100) | 1.32 | 0.48 |
| UDL-11 | Polymer 10 (30) | — | — | Cyclohexanone(100) | 1.35 | 0.41 |
| UDL-12 | Polymer 11 (30) | — | AG1 (1) | Cyclohexanone(100) | 1.40 | 0.37 |
| UDL-13 | Polymer 12 (30) | — | — | Cyclohexanone(100) | 1.36 | 0.49 |
| UDL-14 | Polymer 13 (30) | — | — | Cyclohexanone(100) | 1.34 | 0.49 |
| UDL-15 | Polymer 14 (30) | — | — | Cyclohexanone(100) | 1.32 | 0.38 |
| UDL-16 | Polymer 15 (30) | — | AG1 (1) | Cyclohexanone(100) | 1.33 | 0.37 |
| UDL-17 | Polymer 16 (30) | — | AG1 (1) | Cyclohexanone(100) | 1.35 | 0.48 |
| UDL-18 | Polymer 15 (30) | — | — | Cyclohexanone(100) | 1.40 | 0.36 |
| UDL-19 | Polymer 16 (30) | — | — | Cyclohexanone(100) | 1.35 | 0.44 |
| UDL-20 | Polymer 17 (30) | — | — | Cyclohexanone(100) | 1.36 | 0.39 |
| UDL-21 | Polymer 18 (30) | — | — | Cyclohexanone(100) | 1.35 | 0.45 |
| UDL-22 | Polymer 19 (30) | — | — | Cyclohexanone(100) | 1.32 | 0.39 |
| UDL-23 | Polymer 20 (30) | — | — | Cyclohexanone(100) | 1.35 | 0.39 |
| UDL-24 | Polymer 21 (30) | — | — | Cyclohexanone(100) | 1.36 | 0.40 |
| UDL-25 | Polymer 22 (30) | — | — | Cyclohexanone(100) | 1.34 | 0.42 |
| Comparative Example UDL-1 | Comparative Polymer 1 (28.0) | — | — | PGMEA (70) Cyclohexanone (30) | 1.40 | 0.71 |
| Comparative Example UDL-2 | Comparative Polymer 2 (28.0) | CR1 (5) | AG1 (1) | PGMEA (100) | 1.42 | 0.68 |
| Comparative Example UDL-3 | Comparative Polymer 3 (28.0) | CR1 (5) | AG1 (1) | PGMEA (100) | 1.62 | 0.82 |
| SOG-1 | ArF Silicon-containing intermediate layer polymer 1 (10) | — | — | PGMEA (200) | 1.68 | 0.15 |

PGMEA: Propyleneglycol monomethyl ether acetate

Measurement of Solvent Resistance

A composition for a resist underlayer film UDL-1 was coated on silicon substrates, baked at 290° C., 300° C., 310° C., 320° C., 400° C., and 500° C., respectively, for 60 seconds under nitrogen stream, and then a film thickness of each was measured. A PGMEA solution was dispensed on it, allowed to stand for 30 seconds, spin-dried, baked at 100° C. for 60 seconds to evaporate PGMEA, and then a film thickness was measured. A difference in film thicknesses before and after the PGMEA treatment is shown in Table 2.

TABLE 2

| Baking temperature | Film reduction by PGMEA treatment (Å) |
|---|---|
| 290° C. | 530 |
| 300° C. | 85 |
| 310° C. | 6 |
| 320° C. | 3 |
| 400° C. | 2 |
| 500° C. | 2 |

Reduction of a Film Thickness and Measurement of a Carbon Density

Each composition for a resist underlayer film UDL-1 to UDL-25, and Comparative Examples UDL-1 to UDL-3 was coated on a silicon substrate, baked under a nitrogen stream for 60 seconds at 220° C. and 400° C. each as shown in Table 3, and then a film thickness was measured. A thickness of the film coated with the same rotation speed and baked at 220° C. and 400° C. each was measured by an optical refractometer, and then the ratio of them was calculated. A larger a/b suggests a smaller reduction of film thickness by baking at a high temperature, i.e., a higher heat resistance.

Furthermore, a carbon density (% by weight) of a film baked at 400° C. was obtained by an X-ray microanalyzer measurement (XPS) for UDL-1, UDL-7, and Comparative Example UDL-1.

TABLE 3

| No. | Film thickness after baking at 220° C. (Å): a | Film thickness after baking at 400° C. (Å): b | a/b × 100 (%) | Carbon density (%) |
|---|---|---|---|---|
| UDL-1 | 2472 | 2473 | 100 | 91 |
| UDL-2 | 2350 | 2348 | 100 | |
| UDL-3 | 2383 | 2380 | 100 | |
| UDL-4 | 2830 | 2833 | 100 | |
| UDL-5 | 2650 | 2646 | 100 | |
| UDL-6 | 2680 | 2660 | 99.3 | |
| UDL-7 | 2472 | 2473 | 100 | 91 |
| UDL-8 | 2350 | 2348 | 100 | |
| UDL-9 | 2383 | 2380 | 100 | |
| UDL-10 | 2322 | 2321 | 100 | |
| UDL-11 | 2310 | 2311 | 100 | |
| UDL-12 | 2319 | 2318 | 100 | |
| UDL-13 | 2612 | 2507 | 96 | |
| UDL-14 | 2466 | 2392 | 97 | |
| UDL-15 | 2112 | 2027 | 96 | |
| UDL-16 | 2050 | 2045 | 100 | |
| UDL-17 | 2060 | 2050 | 100 | |
| UDL-18 | 2201 | 2119 | 100 | |
| UDL-19 | 2305 | 2258 | 98 | |
| UDL-20 | 2506 | 2454 | 98 | |
| UDL-21 | 2506 | 2430 | 97 | |
| UDL-22 | 2308 | 2298 | 100 | |
| UDL-23 | 2432 | 2359 | 97 | |
| UDL-24 | 2300 | 2292 | 100 | |
| UDL-25 | 2330 | 2328 | 100 | |

TABLE 3-continued

| No. | Film thickness after baking at 220° C. (Å): a | Film thickness after baking at 400° C. (Å): b | a/b × 100 (%) | Carbon density (%) |
|---|---|---|---|---|
| Comparative Example UDL-1 | 2855 | 2431 | 85 | 82 |
| Comparative Example UDL-2 | 3230 | 1938 | 60 | |
| Comparative Example UDL-3 | 3350 | 1172 | 35 | |

Measurement of a Thermal Weight Loss by DTA

Figure 7:
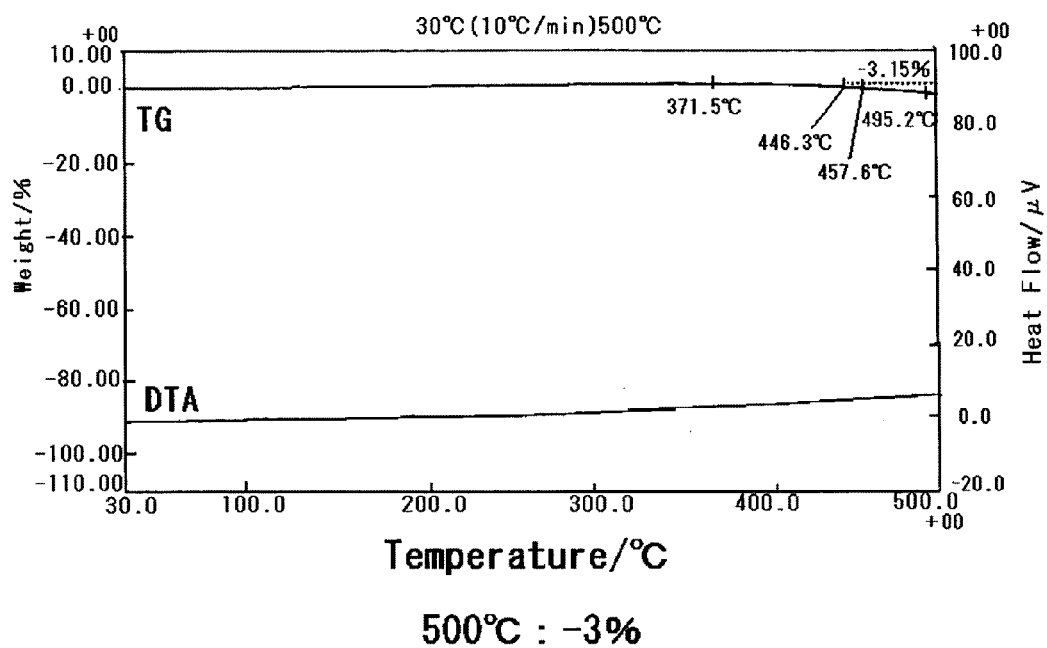
FIG. 7 shows a result of a thermal weight loss of polymer 1, measured by DTA.
Figure 8:
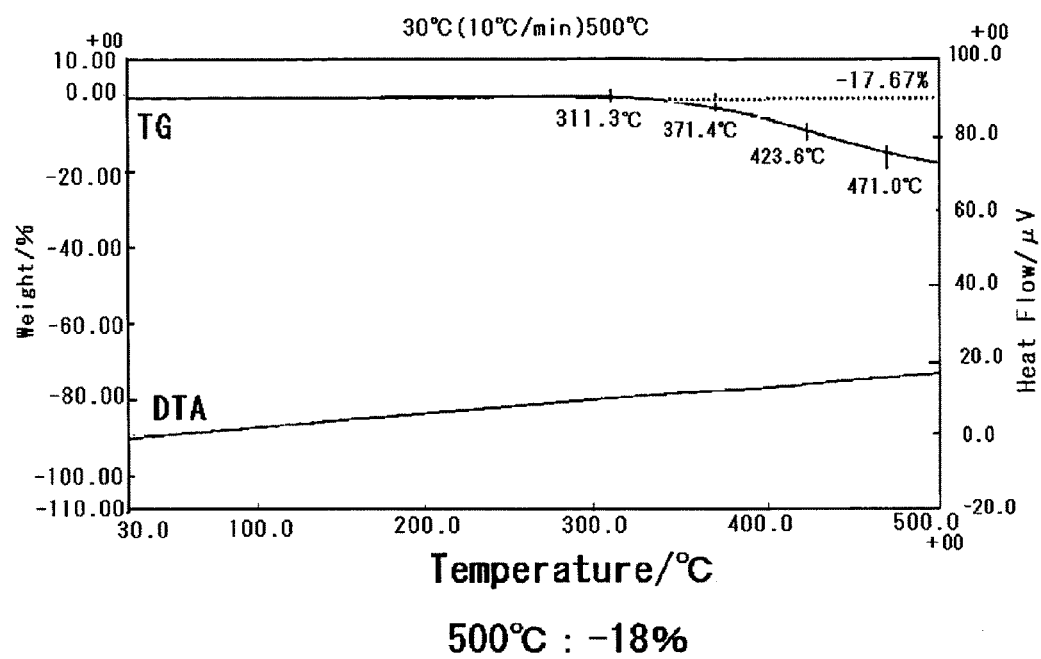
FIG. 8 shows a result of a thermal weight loss of comparative polymer 1, measured by DTA.

A weight change of Polymer 1 and of Comparative Polymer 1 by heating was measured by a differential thermal analysis (DTA). The measurement was done by heating to 300° C. once, cooled to a room temperature, and then heated to 500° C. Results are shown in FIG. 7 for Polymer 1 and in FIG. 8 for Comparative Polymer 1. Ratio of weight loss at 500° C. relative to 30° C. was measured.

Etching Test by a $CF_4/CHF_3$ Gas System

Examples 1 to 27 and Comparative Examples 1 to 8

A composition for a resist underlayer film (UDL-1 to UDL-25 and Comparative Examples UDL-1 to UDL-3) was coated by a spin coat method, baked at each temperature (under baking atmosphere of a nitrogen stream and a baking time of 60 seconds) to form a resist underlayer film, and then a etching test was done by a $CF_4/CHF_3$ gas system with following conditions.

Etching Conditions:

| Chamber pressure: | 40.0 Pa |
| RF power: | 1,300 W |
| $CHF_3$ gas flow rate: | 30 mL/minute |
| $CF_4$ gas flow rate: | 30 mL/minute |
| Ar gas flow rate: | 100 mL/minute |
| Time: | 60 seconds |

Film reduction was obtained by measuring film thickness before and after etching with an etching instrument TE-8500 (manufactured by Tokyo Electron Ltd.). The results are shown in Table 4 and Table 5.

TABLE 4

| | Composition for resist underlayer film | Baking temperature (° C.) | Film reduction by $CF_4/CHF_3$ gas etching (nm) |
|---|---|---|---|
| Example 1 | UDL-1 | 310 | 80 |
| Example 2 | UDL-1 | 350 | 78 |
| Example 3 | UDL-1 | 400 | 75 |
| Example 4 | UDL-2 | 350 | 72 |
| Example 5 | UDL-3 | 350 | 73 |
| Example 6 | UDL-4 | 350 | 70 |
| Example 7 | UDL-5 | 350 | 75 |
| Example 8 | UDL-6 | 350 | 78 |
| Example 9 | UDL-7 | 350 | 80 |
| Example 10 | UDL-8 | 400 | 75 |
| Example 11 | UDL-9 | 350 | 72 |
| Example 12 | UDL-10 | 350 | 70 |
| Example 13 | UDL-11 | 350 | 68 |
| Example 14 | UDL-12 | 350 | 74 |
| Example 15 | UDL-13 | 320 | 90 |
| Example 16 | UDL-14 | 320 | 88 |
| Example 17 | UDL-15 | 320 | 82 |

TABLE 4-continued

| | Composition for resist underlayer film | Baking temperature (° C.) | Film reduction by CF$_4$/CHF$_3$ gas etching (nm) |
|---|---|---|---|
| Example 18 | UDL-16 | 350 | 68 |
| Example 19 | UDL-17 | 330 | 70 |
| Example 20 | UDL-18 | 320 | 75 |
| Example 21 | UDL-19 | 320 | 78 |
| Example 22 | UDL-20 | 320 | 80 |
| Example 23 | UDL-21 | 350 | 82 |
| Example 24 | UDL-22 | 350 | 78 |
| Example 25 | UDL-23 | 320 | 83 |
| Example 26 | UDL-24 | 320 | 77 |
| Example 27 | UDL-25 | 320 | 76 |

TABLE 5

| | Composition for resist underlayer film | Baking temperature (° C.) | Film reduction by CF$_4$/CHF$_3$ gas etching (nm) |
|---|---|---|---|
| Comparative Example 1 | Comparative Example UDL-1 | 350 | 98 |
| Comparative Example 2 | Comparative Example UDL-1 | 250 | 99 |
| Comparative Example 3 | Comparative Example UDL-2 | 350 | 123 |
| Comparative Example 4 | Comparative Example UDL-2 | 250 | 119 |
| Comparative Example 5 | Comparative Example UDL-3 | 350 | 129 |
| Comparative Example 6 | UDL-1 | 250 | 97 |
| Comparative Example 7 | UDL-1 | 290 | 93 |
| Comparative Example 8 | UDL-1 | 300 | 92 |

Test of Pattern Etching

Examples 28 to 55 and Comparative Examples 9 to 15

A composition for a resist underlayer film (UDL-1 to UDL-25 and Comparative examples UDL-1 to UDL-3) was coated on a 300-mm Si wafer substrate having a formed SiO$_2$ film having a film thickness of 200 nm, and then baked at each temperature as shown in Tables 8 and 9 for 60 seconds to obtain a resist underlayer film having a film thickness of 200 nm. Here, baking of the resist underlayer film was done under a nitrogen stream atmosphere.

On it, a composition for a resist intermediate layer film SOG1 was coated, and then baked at 200° C. for 60 seconds to form a resist intermediate layer film having a film thickness of 35 nm. On it, an SL resist for ArF, a composition for a resist upperlayer film, was coated, and then baked at 105° C. for 60 seconds to form a photoresist film having a film thickness of 100 nm. A composition for an immersion top coat (TC-1) was coated on the photoresist film, and then baked at 90° C. for 60 seconds to form a top coat having a film thickness of 50 nm.

A composition for a resist upperlayer film (an SL resist for ArF) was prepared by dissolving a resin shown as an ArF monolayer resist polymer 1, an acid generator PAG 1, and a basic compound TMMEA in a solvent containing 0.1% by mass of FC-430 (manufactured by Sumitomo 3M Ltd.) with a ratio as shown in Table 6 followed by filtering the resulting mixture through a 0.1 µm filter made of a fluorinated polymer.

TABLE 6

| No. | Polymer (parts by mass) | Acid generator (parts by mass) | Basic compound (parts by mass) | Solvent (parts by mass) |
|---|---|---|---|---|
| SL resist for ArF | ArF monolayer resist polymer 1 (100) | PAG 1 (6.6) | TMMEA (0.8) | PGMEA (2,500) |

An ArF monolayer resist polymer 1, PAG 1, and TMMEA are shown hereinbelow.

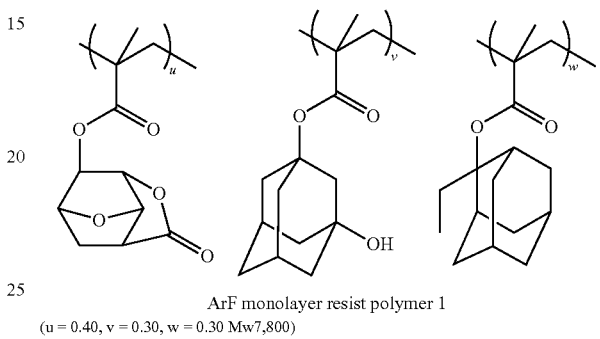

ArF monolayer resist polymer 1
(u = 0.40, v = 0.30, w = 0.30 Mw7,800)

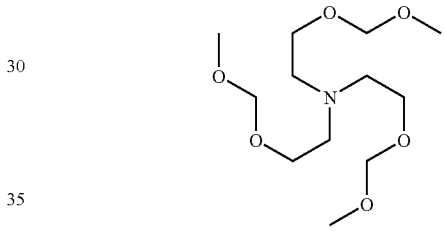

TMMEA

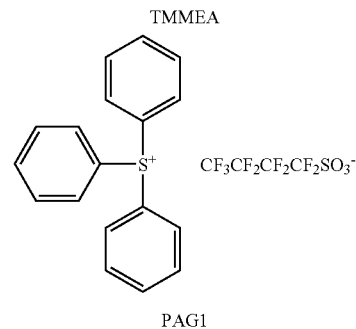

PAG1

A composition for an immersion top coat (TC-1) was prepared by dissolving a top coat polymer in a solvent with a ratio as shown in Table 7 followed by filtering the resulting mixture through a 0.1 µm filter made of a fluorinated polymer.

TABLE 7

| No. | Polymer (parts by mass) | Organic solvent (parts by mass) |
|---|---|---|
| TC-1 | Top coat polymer (100) | Diisoamyl ether (2,700) 2-methyl-1-butanol (270) |

A top coat polymer used is shown hereinbelow.
Top-Coat Polymer:
  Molecular weight (Mw): 8,800
  Dispersivity (Mw/Mn): 1.69

Top-Coat Polymer

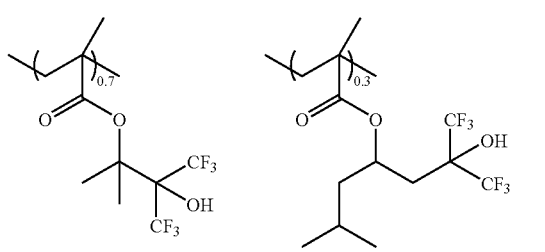

Top coat polymer 1

Then, it was exposed with an ArF immersion exposure instrument NSR-S610C (NA 1.30, σ0.98/0.65, 35° dipole s-polarized light illumination, and a 6% half tone phase shift mask, manufactured by Nikon Corp.), baked (PEB) at 100° C. for 60 seconds, and then developed by a 2.38 mass % aqueous tetramethyl ammonium (TMAH) solution for 30 seconds to obtain a 43 nm 1:1 positive line-and-space pattern.

Then, a resist intermediate layer film was etched by using a resist pattern obtained by dry etching as a mask with an etching instrument Telius (manufactured by Tokyo Electron Ltd.), then a resist underlayer film was etched by using a pattern of the obtained resist intermediate layer film as a mask, and further a $SiO_2$ film was etched by using a pattern of the obtained resist underlayer film as a mask. Etching conditions are as following.

Transcription Conditions of a Resist Pattern to a Resist Intermediate Layer Film:

| | |
|---|---|
| Chamber pressure: | 10.0 Pa |
| RF power: | 1,500 W |
| $CF_4$ gas flow rate: | 75 sccm |
| $O_2$ gas flow rate: | 15 sccm |
| Time: | 15 seconds |

Transcription Conditions of a Pattern of the Resist Intermediate Layer Film to a Resist Underlayer Film:

| | |
|---|---|
| Chamber pressure: | 2.0 Pa |
| RF power: | 500 W |
| Ar gas flow rate: | 75 sccm |
| $O_2$ gas flow rate: | 45 sccm |
| Time: | 120 seconds |

Transcription Conditions of a Resist Underlayer Film Pattern to a $SiO_2$ Film:

| | |
|---|---|
| Chamber pressure: | 2.0 Pa |
| RF power: | 2,200 W |
| $C_5F_{12}$ gas flow rate: | 20 sccm |
| $C_2F_6$ gas flow rate: | 10 sccm |
| Ar gas flow rate: | 300 sccm |
| $O_2$: | 60 sccm |
| Time: | 90 seconds |

A pattern cross-section was observed with an electron microscope S-4700 (manufactures by Hitachi, Ltd.), and pattern profile were compared. The results are shown in Tables 8 and 9.

TABLE 8

| | Composition for underlayer film | Baking temperature (° C.) | Pattern profile after development | Profile after transcription etching of intermediate layer | Profile after transcription etching of underlayer film | Profile after transcription etching of substrate | Pattern twist after transcription etching of substrate |
|---|---|---|---|---|---|---|---|
| Example 28 | UDL-1 | 310 | Vertical profile | Vertical profile | Vertical profile | Vertical profile | No |
| Example 29 | UDL-1 | 320 | Vertical profile | Vertical profile | Vertical profile | Vertical profile | No |
| Example 30 | UDL-1 | 350 | Vertical profile | Vertical profile | Vertical profile | Vertical profile | No |
| Example 31 | UDL-2 | 350 | Vertical profile | Vertical profile | Vertical profile | Vertical profile | No |
| Example 32 | UDL-3 | 350 | Vertical profile | Vertical profile | Vertical profile | Vertical profile | No |
| Example 33 | UDL-4 | 350 | Vertical profile | Vertical profile | Vertical profile | Vertical profile | No |
| Example 34 | UDL-5 | 350 | Vertical profile | Vertical profile | Vertical profile | Vertical profile | No |
| Example 35 | UDL-6 | 350 | Vertical profile | Vertical profile | Vertical profile | Vertical profile | No |
| Example 36 | UDL-1 | 400 | Vertical profile | Vertical profile | Vertical profile | Vertical profile | No |
| Example 37 | UDL-7 | 350 | Vertical profile | Vertical profile | Vertical profile | Vertical profile | No |
| Example 38 | UDL-8 | 400 | Vertical profile | Vertical profile | Vertical profile | Vertical profile | No |
| Example 39 | UDL-9 | 350 | Vertical profile | Vertical profile | Vertical profile | Vertical profile | No |
| Example 40 | UDL-10 | 350 | Vertical profile | Vertical profile | Vertical profile | Vertical profile | No |
| Example 41 | UDL-11 | 350 | Vertical profile | Vertical profile | Vertical profile | Vertical profile | No |
| Example 42 | UDL-12 | 350 | Vertical profile | Vertical profile | Vertical profile | Vertical profile | No |
| Example 43 | UDL-13 | 320 | Vertical profile | Vertical profile | Vertical profile | Vertical profile | No |

TABLE 8-continued

| | Composition for underlayer film | Baking temperature (° C.) | Pattern profile after development | Profile after transcription etching of intermediate layer | Profile after transcription etching of underlayer film | Profile after transcription etching of substrate | Pattern twist after transcription etching of substrate |
|---|---|---|---|---|---|---|---|
| Example 44 | UDL-14 | 320 | Vertical profile | Vertical profile | Vertical profile | Vertical profile | No |
| Example 45 | UDL-15 | 320 | Vertical profile | Vertical profile | Vertical profile | Vertical profile | No |
| Example 46 | UDL-16 | 350 | Vertical profile | Vertical profile | Vertical profile | Vertical profile | No |
| Example 47 | UDL-17 | 330 | Vertical profile | Vertical profile | Vertical profile | Vertical profile | No |
| Example 48 | UDL-18 | 320 | Vertical profile | Vertical profile | Vertical profile | Vertical profile | No |
| Example 49 | UDL-19 | 320 | Vertical profile | Vertical profile | Vertical profile | Vertical profile | No |
| Example 50 | UDL-20 | 320 | Vertical profile | Vertical profile | Vertical profile | Vertical profile | No |
| Example 51 | UDL-21 | 350 | Vertical profile | Vertical profile | Vertical profile | Vertical profile | No |
| Example 52 | UDL-22 | 350 | Vertical profile | Vertical profile | Vertical profile | Vertical profile | No |
| Example 53 | UDL-23 | 320 | Vertical profile | Vertical profile | Vertical profile | Vertical profile | No |
| Example 54 | UDL-24 | 320 | Vertical profile | Vertical profile | Vertical profile | Vertical profile | No |
| Example 55 | UDL-25 | 320 | Vertical profile | Vertical profile | Vertical profile | Vertical profile | No |

TABLE 9

| | Composition for underlayer film | Baking temperature (° C.) | Pattern profile after development | profile after transcription etching of intermediate layer | profile after transcription etching of underlayer film | profile after transcription etching of substrate | Twist after transcription etching of substrate |
|---|---|---|---|---|---|---|---|
| Comparative Example 9 | Comparative Example UDL-1 | 350 | Vertical profile | Vertical profile | Vertical profile | Tapered profile and film reduction | Yes |
| Comparative Example 10 | Comparative Example UDL-2 | 350 | Vertical profile | Vertical profile | Vertical profile | Tapered profile | Yes |
| Comparative Example 11 | Comparative Example UDL-3 | 350 | Vertical profile | Vertical profile | Vertical profile | Tapered profile | Yes |
| Comparative Example 12 | UDL-1 | 250 | Vertical profile | Vertical profile | Vertical profile | Vertical profile | Yes |
| Comparative Example 13 | UDL-1 | 280 | Vertical profile | Vertical profile | Vertical profile | Vertical profile | Yes |
| Comparative Example 14 | UDL-1 | 290 | Vertical profile | Vertical profile | Vertical profile | Vertical profile | Yes |
| Comparative Example 15 | UDL-1 | 300 | Vertical profile | Vertical profile | Vertical profile | Vertical profile | Yes |

As can be seen in Table 1, a resist underlayer film formed by a method and a composition for a resist underlayer film of the present invention has a refractive index practically usable for a resist underlayer film of a multilayer resist film having at least three layers used in a lithography. As can be seen in Table 2, a solvent-insoluble film is formed by baking at a temperature above 300° C., and thus a film reduction by treatment with a solvent is largely suppressed. As can been seen in Table 4 and Table 5, an etching speed of a resist underlayer film obtained by baking at a temperature above 300° C. according to the present invention by using $CF_4/CHF_3$ gas is sufficiently slower than UDL-1 baked at 300° C. or lower, Comparative Examples UDL-1 and UDL-2 using a novolak resin, and Comparative Example UDL-3 using polyhydroxy styrene, resulting in increase in an etching resistance. Similarly, a resist underlayer film formed by using a composition for a resist underlayer film of the present invention showed a sufficiently slow etching speed, resulting in a high etching resistance. As can be seen in Table 8 and Table 9, Examples 28 to 55, which are done by using a composition for a resist underlayer film of the present invention and by baking at above 300° C. according to the present invention, show that a profile of a resist after development and of a resist underlayer film after an oxygen etching and a substrate etching are excellent with no pattern wiggling.

It must be stated here that the present invention is not limited to the above-mentioned embodiments. The embodiments shown above are mere examples so that any embodiment composed of substantially the same technical concept as disclosed in the claims of the present invention and expressing a similar effect is included in the technical scope of the present invention.

What is claimed is:

1. A method for forming a resist underlayer film of a multilayer resist film having at least three layers used in a lithography, comprising at least:

a step of coating a substrate with a composition for a resist underlayer film containing a novolak resin represented by the following general formula (1) obtained by treating a compound having a bisnaphthol group; and a step of curing the coated composition for a resist underlayer film by a heat treatment at a temperature above 300° C. and 600° C. or lower for 10 to 600 seconds,

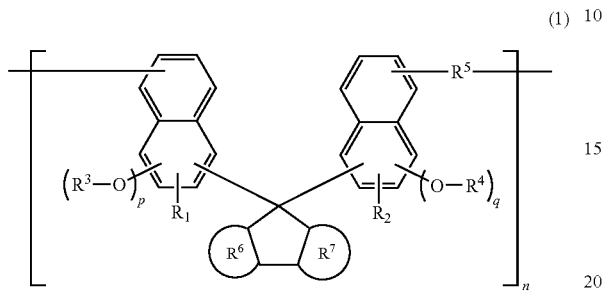

(1)

wherein
$R^1$ and $R^2$ represent the same or a different hydrogen atom, a linear, a branched, or a cyclic alkyl group having 1 to 10 carbon atoms, an aryl group having 6 to 20 carbon atoms, or an alkenyl group having 2 to 20 carbon atoms;
$R^3$ and $R^4$ each represents a hydrogen atom or a glycidyl group;
$R^5$ represents a single bond, or a linear or a branched alkylene group having 1 to 10 carbon atoms;
$R^6$ and $R^7$ represent a benzene ring or a naphthalene ring; each reference character p and q represents 1 or 2; and
a reference character n is $0<n\leq1$, wherein n represents a mole ratio of components in the novolak resin.

2. The method for forming a resist underlayer film according to claim 1, wherein the composition for a resist underlayer film to be coated on the substrate contains a resin represented by the following general formula (2) and having a weight-average molecular weight of 500 to 100,000,

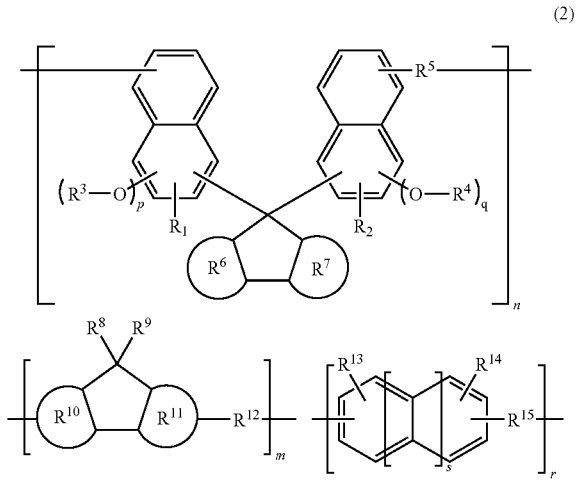

(2)

wherein
$R^1$ to $R^7$, and reference characters p and q represent the same meaning as before;
$R^8$ and $R^9$ represent a hydrogen atom, a hydroxy group, an acyl group having 1 to 6 carbon atoms, an alkoxy group having 1 to 6 carbon atoms, an alkoxycarbonyl group having 1 to 6 carbon atoms, a carbonyl group, an amino group, an imino group, a hydroxy group substituted with an acid-labile or a glycidyl group, or a linear, a branched, or a cyclic alkyl group having 1 to 10 carbon atoms, an aryl group having 6 to 20 carbon atoms, an alkenyl group having 2 to 10 carbon atoms, or an alkynyl group having 2 to 10 carbon atoms;
$R^{10}$ and $R^{11}$ represent a benzene ring or a naphthalene ring;
$R^{13}$ and $R^{14}$ represent a hydrogen atom, a hydroxy group, or a linear, a branched, or a cyclic alkyl group having 1 to 10 carbon atoms, wherein $R^{13}$ and $R^{14}$ may be bonded to form a ring;
$R^{12}$ and $R^{15}$ represent a linear or a branched alkylene group having 1 to 10 carbon atoms;
reference character s represents 1 or 2; and
reference characters n, m, and r respectively represent molar ratios of components in the resin of formula (2) and satisfy $0<n<1.0$, $0\leq m<1.0$, $0\leq r<1.0$, and $0<m+r<1.0$.

3. The method for forming a resist underlayer film according to claim 2, wherein the step of coating the substrate with the composition for a resist underlayer film is carried out by a spin coat method.

4. A patterning process to form a pattern on a substrate by a lithography, comprising at least:
forming a resist underlayer film on a substrate by the method for forming the resist underlayer film according to claim 3;
forming a resist intermediate layer film by using a composition for the resist intermediate layer film containing a silicon atom on the resist underlayer film;
forming a resist upperlayer film by using a composition for the resist upperlayer film consisting of a photoresist composition on the resist intermediate layer film;
forming a resist pattern on the resist upperlayer film by development with a developer after exposing to light a pattern circuit region of the resist upperlayer film;
etching the resist intermediate layer film by using the obtained resist pattern as an etching mask;
etching the resist underlayer film by using the obtained pattern of the resist intermediate layer film as an etching mask; and
etching the substrate by using the obtained pattern of the resist underlayer film as an etching mask to obtain a pattern on a substrate.

5. A patterning process to form a pattern on a substrate by a lithography, comprising at least:
forming a resist underlayer film on a substrate by the method for forming the resist underlayer film according to claim 3;
forming an inorganic hard mask intermediate film selected from the group consisting of a silicon oxide film, a silicon nitride film, and a silicon oxynitride film on the resist underlayer film;
forming an organic anti-reflection film on the inorganic hard mask intermediate film;
forming a resist upperlayer film by using a composition for the resist upperlayer film consisting of a photoresist composition on the organic anti-reflection film;
forming a resist pattern on the resist upperlayer film by development with a developer after exposing to light a pattern circuit region of the resist upperlayer film;
etching the organic anti-reflection film and the inorganic hard mask intermediate film by using the obtained resist pattern as an etching mask;

etching the resist underlayer film by using the obtained pattern of an inorganic hard mask intermediate film as an etching mask; and etching the substrate by using the obtained pattern of the resist underlayer film as an etching mask to obtain a pattern on a substrate.

6. The patterning process according to claim 5, wherein the inorganic hard mask intermediate film is formed by chemical vapor deposition (CVD) method or an atomic layer deposition (ALD) method.

7. The patterning process according to claim 6, wherein the photoresist composition does not contain a polymer having a silicon atom.

8. The patterning process according to claim 7, wherein the step of etching the resist underlayer film by using the pattern of the inorganic hard mask intermediate film as an etching mask is carried out by using an etching gas containing an oxygen gas or a hydrogen gas.

9. A patterning process to form a pattern on a substrate by a lithography, comprising at least:

forming a resist underlayer film on a substrate by the method for forming the resist underlayer film according to claim 2;

forming a resist intermediate layer film by using a composition for the resist intermediate layer film containing a silicon atom on the resist underlayer film;

forming a resist upperlayer film by using a composition for the resist upperlayer film consisting of a photoresist composition on the resist intermediate layer film;

forming a resist pattern on the resist upperlayer film by development with a developer after exposing to light a pattern circuit region of the resist upperlayer film;

etching the resist intermediate layer film by using the obtained resist pattern as an etching mask;

etching the resist underlayer film by using the obtained pattern of the resist intermediate layer film as an etching mask; and etching the substrate by using the obtained pattern of the resist underlayer film as an etching mask to obtain a pattern on a substrate.

10. A patterning process to form a pattern on a substrate by a lithography, comprising at least:

forming a resist underlayer film on a substrate by the method for forming the resist underlayer film according to claim 2;

forming an inorganic hard mask intermediate film selected from the group consisting of a silicon oxide film, a silicon nitride film, and a silicon oxynitride film on the resist underlayer film;

forming a resist upperlayer film by using a composition for the resist upperlayer film consisting of a photoresist composition on the inorganic hard mask intermediate film;

forming a resist pattern on the resist upperlayer film by development with a developer after exposing to light a pattern circuit region of the resist upperlayer film;

etching the inorganic hard mask intermediate film by using the obtained resist pattern as an etching mask;

etching the resist underlayer film by using the obtained pattern of the inorganic hard mask intermediate film as an etching mask; and etching the substrate by using the obtained pattern of the resist underlayer film as an etching mask to obtain a pattern on a substrate.

11. A patterning process to form a pattern on a substrate by a lithography, comprising at least:

forming a resist underlayer film on a substrate by the method for forming the resist underlayer film according to claim 3;

forming an inorganic hard mask intermediate film selected from the group consisting of a silicon oxide film, a silicon nitride film, and a silicon oxynitride film on the resist underlayer film;

forming a resist upperlayer film by using a composition for the resist upperlayer film consisting of a photoresist composition on the inorganic hard mask intermediate film;

forming a resist pattern on the resist upperlayer film by development with a developer after exposing to light a pattern circuit region of the resist upperlayer film;

etching the inorganic hard mask intermediate film by using the obtained resist pattern as an etching mask;

etching the resist underlayer film by using the obtained pattern of the inorganic hard mask intermediate film as an etching mask; and etching the substrate by using the obtained pattern of the resist underlayer film as an etching mask to obtain a pattern on a substrate.

12. A patterning process to form a pattern on a substrate by a lithography, comprising at least:

forming a resist underlayer film on a substrate by the method for forming the resist underlayer film according to claim 2;

forming an inorganic hard mask intermediate film selected from the group consisting of a silicon oxide film, a silicon nitride film, and a silicon oxynitride film on the resist underlayer film;

forming an organic anti-reflection film on the inorganic hard mask intermediate film;

forming a resist upperlayer film by using a composition for the resist upperlayer film consisting of a photoresist composition on the organic anti-reflection film;

forming a resist pattern on the resist upperlayer film by development with a developer after exposing to light a pattern circuit region of the resist upperlayer film;

etching the organic anti-reflection film and the inorganic hard mask intermediate film by using the obtained resist pattern as an etching mask;

etching the resist underlayer film by using the obtained pattern of an inorganic hard mask intermediate film as an etching mask; and etching the substrate by using the obtained pattern of the resist underlayer film as an etching mask to obtain a pattern on a substrate.

13. The method for forming a resist underlayer film according to claim 1, wherein the step of coating the substrate with the composition for a resist underlayer film is carried out by a spin coat method.

14. A patterning process to form a pattern on a substrate by a lithography, comprising at least:

forming a resist underlayer film on a substrate by the method for forming the resist underlayer film according to claim 13;

forming a resist intermediate layer film by using a composition for the resist intermediate layer film containing a silicon atom on the resist underlayer film;

forming a resist upperlayer film by using a composition for the resist upperlayer film consisting of a photoresist composition on the resist intermediate layer film;

forming a resist pattern on the resist upperlayer film by development with a developer after exposing to light a pattern circuit region of the resist upperlayer film;

etching the resist intermediate layer film by using the obtained resist pattern as an etching mask;

etching the resist underlayer film by using the obtained pattern of the resist intermediate layer film as an etching mask; and etching the substrate by using the obtained pattern of the resist underlayer film as an etching mask to obtain a pattern on a substrate.

15. A patterning process to form a pattern on a substrate by a lithography, comprising at least:

forming a resist underlayer film on a substrate by the method for forming the resist underlayer film according to claim 13;

forming an inorganic hard mask intermediate film selected from the group consisting of a silicon oxide film, a silicon nitride film, and a silicon oxynitride film on the resist underlayer film;

forming a resist upperlayer film by using a composition for the resist upperlayer film consisting of a photoresist composition on the inorganic hard mask intermediate film;

forming a resist pattern on the resist upperlayer film by development with a developer after exposing to light a pattern circuit region of the resist upperlayer film;

etching the inorganic hard mask intermediate film by using the obtained resist pattern as an etching mask;

etching the resist underlayer film by using the obtained pattern of the inorganic hard mask intermediate film as an etching mask; and etching the substrate by using the obtained pattern of the resist underlayer film as an etching mask to obtain a pattern on a substrate.

16. A patterning process to form a pattern on a substrate by a lithography, comprising at least:

forming a resist underlayer film on a substrate by the method for forming the resist underlayer film according to claim 13;

forming an inorganic hard mask intermediate film selected from the group consisting of a silicon oxide film, a silicon nitride film, and a silicon oxynitride film on the resist underlayer film;

forming an organic anti-reflection film on the inorganic hard mask intermediate film;

forming a resist upperlayer film by using a composition for the resist upperlayer film consisting of a photoresist composition on the organic anti-reflection film;

forming a resist pattern on the resist upperlayer film by development with a developer after exposing to light a pattern circuit region of the resist upperlayer film;

etching the organic anti-reflection film and the inorganic hard mask intermediate film by using the obtained resist pattern as an etching mask;

etching the resist underlayer film by using the obtained pattern of an inorganic hard mask intermediate film as an etching mask; and etching the substrate by using the obtained pattern of the resist underlayer film as an etching mask to obtain a pattern on a substrate.

17. A patterning process to form a pattern on a substrate by a lithography, comprising at least:

forming a resist underlayer film on a substrate by the method for forming the resist underlayer film according to claim 1;

forming a resist intermediate layer film by using a composition for the resist intermediate layer film containing a silicon atom on the resist underlayer film;

forming a resist upperlayer film by using a composition for the resist upperlayer film consisting of a photoresist composition on the resist intermediate layer film;

forming a resist pattern on the resist upperlayer film by development with a developer after exposing to light a pattern circuit region of the resist upperlayer film;

etching the resist intermediate layer film by using the obtained resist pattern as an etching mask;

etching the resist underlayer film by using the obtained pattern of the resist intermediate layer film as an etching mask; and etching the substrate by using the obtained pattern of the resist underlayer film as an etching mask to obtain a pattern on a substrate.

18. The patterning process according to claim 17, wherein the photoresist composition does not contain a polymer having a silicon atom.

19. The patterning process according to claim 18, wherein the step of etching the resist underlayer film by using the pattern of the inorganic hard mask intermediate film as an etching mask is carried out by using an etching gas containing an oxygen gas or a hydrogen gas.

20. A patterning process to form a pattern on a substrate by a lithography, comprising at least:

forming a resist underlayer film on a substrate by the method for forming the resist underlayer film according to claim 1;

forming an inorganic hard mask intermediate film selected from the group consisting of a silicon oxide film, a silicon nitride film, and a silicon oxynitride film on the resist underlayer film;

forming a resist upperlayer film by using a composition for the resist upperlayer film consisting of a photoresist composition on the inorganic hard mask intermediate film;

forming a resist pattern on the resist upperlayer film by development with a developer after exposing to light a pattern circuit region of the resist upperlayer film;

etching the inorganic hard mask intermediate film by using the obtained resist pattern as an etching mask;

etching the resist underlayer film by using the obtained pattern of the inorganic hard mask intermediate film as an etching mask; and etching the substrate by using the obtained pattern of the resist underlayer film as an etching mask to obtain a pattern on a substrate.

21. The patterning process according to claim 20, wherein the inorganic hard mask intermediate film is formed by chemical vapor deposition (CVD) method or an atomic layer deposition (ALD) method.

22. A patterning process to form a pattern on a substrate by a lithography, comprising at least:

forming a resist underlayer film on a substrate by the method for forming the resist underlayer film according to claim 1;

forming an inorganic hard mask intermediate film selected from the group consisting of a silicon oxide film, a silicon nitride film, and a silicon oxynitride film on the resist underlayer film;

forming an organic anti-reflection film on the inorganic hard mask intermediate film;

forming a resist upperlayer film by using a composition for the resist upperlayer film consisting of a photoresist composition on the organic anti-reflection film;

forming a resist pattern on the resist upperlayer film by development with a developer after exposing to light a pattern circuit region of the resist upperlayer film;

etching the organic anti-reflection film and the inorganic hard mask intermediate film by using the obtained resist pattern as an etching mask;

etching the resist underlayer film by using the obtained pattern of an inorganic hard mask intermediate film as an etching mask; and etching the substrate by using the obtained pattern of the resist underlayer film as an etching mask to obtain a pattern on a substrate.

* * * * *